(12) United States Patent
Miyano et al.

(10) Patent No.: US 7,153,079 B2
(45) Date of Patent: Dec. 26, 2006

(54) AUTOMATED GUIDED VEHICLE

(75) Inventors: Ken Miyano, Kameoka (JP); Takahiko Murayama, Kyoto (JP); Takashi Nakao, Neyagawa (JP); Shuji Akiyama, Nirasaki (JP)

(73) Assignees: Murata Kikai Kabushiki Kaisha, Kyoto (JP); Tokyo Electron Limited, Tokyo (JP)

( * ) Notice: Subject to any disclaimer, the term of this patent is extended or adjusted under 35 U.S.C. 154(b) by 162 days.

(21) Appl. No.: 10/416,168

(22) PCT Filed: Sep. 5, 2002

(86) PCT No.: PCT/JP02/09018

§ 371 (c)(1),
(2), (4) Date: May 16, 2003

(87) PCT Pub. No.: WO03/026002

PCT Pub. Date: Mar. 27, 2003

(65) Prior Publication Data

US 2004/0052624 A1 Mar. 18, 2004

(30) Foreign Application Priority Data

Sep. 18, 2001 (JP) ............................. 2001-283810
Dec. 20, 2001 (JP) ............................. 2001-387557
Feb. 15, 2002 (JP) ............................. 2002-038343

(51) Int. Cl.
*B65G 1/07* (2006.01)
*H01L 21/68* (2006.01)
(52) U.S. Cl. ............................................... 414/416.01
(58) Field of Classification Search ........... 414/416.01, 414/539, 297
See application file for complete search history.

(56) References Cited

U.S. PATENT DOCUMENTS 5,628,683 A * 5/1997 Gentischer .................. 454/187
5,636,960 A * 6/1997 Hiroki et al. ................ 414/781
6,013,112 A * 1/2000 Iizuka et al. ................ 29/25.01

(Continued)

FOREIGN PATENT DOCUMENTS

JP 11-274264 * 11/1999

(Continued)

*Primary Examiner*—Kathy Matecki
*Assistant Examiner*—Charles A. Fox
(74) *Attorney, Agent, or Firm*—Westerman, Hattori, Daniels & Adrian, LLP.

(57) ABSTRACT

In an automated guided vehicle including a transfer equipment which transfers a wafer, a buffer cassette which temporarily stores the wafer, and a pressing member which is provided at an opening of the buffer cassette, when traveling the automated guided vehicle, if the pressing member is slid to a center position from an end position of the opening of the buffer cassette to contact and press against the edge of the wafer, the pressing member was easily damaged by being rubbed against a periphery of the wafer, and there was a problem in durability of the pressing member.

The pressing member 55 can transfer between a "pressing" position which contacts against the edge of the wafer 10 to press the wafer 10, and a "receding" position which is located away from the edge of the wafer 10. A transferring direction A of the pressing member 55 of a moment in which the pressing member 55 contacts against the edge of the wafer 10 when the pressing member 55 transfers from the "receding" position to the "pressing" position, is approximately perpendicular to an outline of the part of the wafer 10 contacted against the pressing member 55.

2 Claims, 18 Drawing Sheets

U.S. PATENT DOCUMENTS

| | | | |
|---|---|---|---|
| 6,278,905 B1 * | 8/2001 | Saito | 700/247 |
| 6,364,922 B1 * | 4/2002 | Tanaka et al. | 55/385.1 |
| 6,524,057 B1 * | 2/2003 | Park | 414/663 |
| 6,594,560 B1 * | 7/2003 | Lee | 701/23 |
| 2002/0044860 A1 * | 4/2002 | Hayashi et al. | 414/416.03 |
| 2004/0120797 A1 * | 6/2004 | Paul et al. | 414/217.1 |

FOREIGN PATENT DOCUMENTS

| | | | |
|---|---|---|---|
| JP | 2001-223197 | * | 8/2001 |

* cited by examiner

AUTOMATED GUIDED VEHICLE

FIELD OF THE INVENTION

The present invention relates to an automated guided vehicle which automatically transports and transfers a semiconductor wafer between stations in a semiconductor manufacturing plant.

DESCRIPTION OF THE RELATED ART

Conventionally, in the semiconductor manufacturing plant where a generation of dust becomes a problem, a technology is being considered for transferring and transporting the semiconductor wafer by automatically traveling an automated guided vehicle having a scalar arm typed robot and a buffer cassette which temporarily stores the wafer. When loading the wafer to the automated guided vehicle, first, the automated guided vehicle moves to a front of an automatic warehouse or the like. Then, the robot takes out the wafer from the automatic warehouse or the like one sheet at a time. The robot is inserted from an opening of the buffer cassette, and the wafer is stored to one of a plurality of bins formed in the buffer cassette. The bins formed in the buffer cassette are arranged horizontally. When the robot which is holding the wafer releases the wafer after being inserted to the bin, the wafer can be stored to the bin. By repeating this process, the wafer can be stored to the buffer cassette one by one.

When the loading of the wafer completes, the automated guided vehicle starts to travel. However, if the automated guided vehicle is advanced or receded with the buffer cassette in the horizontal state, there is a possibility for the wafer to jump out from the opening of the buffer cassette by inertia. In particular, at starting and at stopping, since a change in a traveling speed of the automated guided vehicle is large, the possibility for the wafer to jump out is large.

To solve such a problem, a structure is being considered which can turn the opening of the buffer cassette to face directly upward during the traveling of the automated guided vehicle.

A specific example of such a structure will be described. A base frame is provided on an upper surface of a vehicle main body, and the buffer cassette is provided on the base frame. In this case, the buffer cassette is provided rotatable in relation to the base frame. An actuator which rotates the buffer cassette is provided inside the base frame such that the buffer cassette can be switched between a horizontal state and a vertical state. According to this structure, during the traveling of the automated guided vehicle when the inertia force is applied to the wafer, the opening of the buffer cassette is facing upward. Therefore, there is no possibility for the wafer to jump out from the opening by defying gravity. However, such a structure is large scaled, and causes a great increase in a manufacturing cost of the automated guided vehicle.

Therefore, to solve the problem of jumping out of the wafer, following structure is being considered.

That is, a bar-shaped pressing member is provided at the opening (slot) of the buffer cassette. When loading and unloading the wafer in relation to the buffer cassette, the pressing member recedes to a position on an edge of the opening. Meanwhile, when traveling the automated guided vehicle, the pressing member moves to a center of the opening of the buffer cassette, and the pressing member contacts and presses against an edge of the wafer to prevent the wafer from jumping out.

However, there is a request for the pressing member, which contacts and presses against an expensive wafer, to have a structure in which a part that contacts against the edge of the wafer is formed softly such that the wafer is not damaged.

Meanwhile, the wafer is usually formed in a disk shape from a silicon single crystal having a thickness of one millimeter. Therefore, there were problems that when the pressing member contacts against the edge of the wafer, the pressing member is damaged, and in extreme cases, the pressing member is cut.

Moreover, a transportation system is being considered in which when transporting the wafer or the like formed from the silicon single crystal, etc. to be used for manufacturing a semiconductor device, the buffer cassette, which stores a plurality of wafers under a stacked state with a constant interval, is transported to a prescribed destination by the automated guided vehicle. The buffer cassette is equipped in the automated guided vehicle. The buffer cassette has an opening which permits the wafer to be loaded and unloaded. In addition, in the automated guided vehicle, a pressing means is provided in proximity to the opening of the buffer cassette for preventing the wafer stored in the buffer cassette from jumping out during the transportation due to vibration or the like.

For example, in a buffer cassette 1101 shown in FIG. 13, a lower cassette 1111 which can store a plurality of 12 inch sized wafers Wb is provided in a lower part of the buffer cassette 1101. An upper cassette 1112 which can store a plurality of 8 inch sized wafers Ws is provided in an upper part of the buffer cassette 1101. One side of the buffer cassette 1101 has an opening to form an opening 1101a, and a pressing means 1102 is provided in proximity to an outside of the opening 1101a. The pressing member 1102 is formed from a base 1102a which extends upward from a placing face 1150 of the buffer cassette 1101, and a pressing part 1102b which is fixed on the base 1102a and extends upward from the base 1102a. As shown in FIG. 14, an elastic member 1122 for pressing the wafers Wb, Ws is supported by a supporting member 1121. The pressing part 1102b has a length which can cover a range slightly wider than a storage range of the wafers Wb·Ws in the vertical direction. By pressing the pressing part 1102b to the buffer cassette 1101 side, and contacting the elastic member 1122 against the wafers Wb·Ws which are protruding from the opening 1101a, the wafers Wb·Ws are prevented from moving within the upper cassette 1112 and the lower cassette 1111, or from jumping out to the outside.

In the above-described buffer cassette 1101, the pressing means 1102 is pushed by a cylinder 1131. A pushing force of the cylinder 1131 is set to push the pressing member 1102 by a strength such that the wafers Wb·Ws do not move under a state in which the wafers Wb·Ws are stored full in the upper and lower cassettes 1111·1112. Therefore, when a number of wafers Wb·Ws stored in the upper and lower cassettes 1111·1112 is small, the pressing force of the pressing means 1102 applied to each of the wafers Wb·Ws is excessive, and there is a possibility for the wafers Wb·Ws to be damaged.

Moreover, there are cases when a protrusion of the wafer Ws stored in the upper cassette 1112 and a protrusion of the wafer Wb stored in the lower cassette 1111 from the opening 1101a are different due to an error or the like in an attaching position of the upper cassette 1112 and the lower cassette 1111 on the buffer cassette 1101. For example, as shown in FIG. 13, when the protrusion of the wafer Ws is smaller than the protrusion of the wafer Wb, a gap d is formed between the wafer Ws and the pressing part 1102b, and the wafer Ws cannot be pressed.

Moreover, there is a conventional automated guided vehicle system wherein the automated guided vehicle, which is loaded with a transfer equipment for transferring a cassette having a plurality of bins for storing the wafer, transfers the cassette to a plurality of inspecting devices provided along the transportation path of the automated guided vehicle. Under this system, a single wafer transfer equipment, which takes out the wafer one sheet at a time from the cassette and transfers the wafer to an inspecting unit one sheet at a time, is provided in each of the inspective devices. Therefore, a number of inspecting devices to be provided increases accompanying an increase in a scale of the system, and a number of single wafer transfer equipments required also increases. Furthermore, in the case of a limited production of a wide variety of products, since different inspecting device is required according to the variety of the product, even when a number of wafers to be inspected is one or two sheet, each inspecting device is required to be supplied with a cassette which can store, for example, 25 sheets. As a result, an extremely large number of cassettes become necessary, and a size of the stocker which stores the cassettes had to be large.

Therefore, a following system is being considered. That is, a buffer cassette having a plurality of bins for storing the wafer, and a single wafer transfer equipment are loaded to an automated guided vehicle. Then, for example, the single wafer transfer equipment stores into the buffer cassette sequentially, the wafer from the cassette placed at a station of the stocker. The wafer is transported to a target inspecting device, and the wafer is transferred directly to the target inspecting device.

In such a system, for example, when an abnormality such as a power failure generates, to carry out a maintenance to an inspecting device adjacent to an inspecting device expected to receive a wafer, there are cases when a worker takes out the wafer from the inspecting device which the maintenance is being carried out, and temporarily places the wafer in the buffer cassette of the automated guided vehicle. In addition, there are cases when the worker recovers the system by forgetting that the wafer has been temporarily placed in the buffer cassette. In such cases, if the inspected wafer stored in the inspecting device expected to receive a wafer, is stored to the bin of the automated guided vehicle where another wafer is temporarily placed, the wafers can be damaged by contacting against one another. Therefore, it becomes necessary to inspect (map) whether or not the wafer is stored in each of the bins of the buffer cassette. The mapping is carried out by moving a pair of transmissive sensors along the bins. When mapping, if the wafer is temporarily placed on the bin under a state in which protruding from the opening of the buffer cassette such that the worker can visually confirm the wafer, the sensors contact against the temporarily placed wafer, and there is a possibility for the wafer to be damaged.

Furthermore, there are cases when the wafer jumps out from the buffer cassette due to acceleration and deceleration during the traveling of the automated guided vehicle. When the mapping is carried out with the wafer jumping out from the buffer cassette, there is a possibility for the sensors to contact against the wafer to damage the wafer.

The present invention was made in consideration to the above-described circumstance. An advantage of the present invention is to provide a durable mechanism for preventing a jumping out of a wafer. Another advantage of the present invention is to provide an automated guided vehicle which does not damage a wafer when pressing the wafer by a pressing member. In addition, another advantage of the present invention is to provide an automated guided vehicle including a single wafer transfer equipment and a buffer cassette, which does not damage the wafer when mapping the wafer stored in the buffer cassette.

DISCLOSURE OF THE INVENTION

The problems to be solved by the present invention are as described above. In the following, means for solving the problems will be described.

That is, according to claim 1, the automated guided vehicle includes a transfer equipment which transfers a wafer, and a buffer cassette which stores the wafer temporarily. In the automated guided vehicle, a pressing member which contacts and presses against an edge of the wafer stored in the buffer cassette is provided at an opening of the buffer cassette. The pressing member can transfer between a "pressing" position which contacts and presses against the edge of the wafer and a "receding" position which is located away from the edge of the wafer. A transferring direction of the pressing member of a moment when the pressing member transfers from the "receding" position to the "pressing" position to contact against the wafer, is approximately perpendicular to a profile line of the part of the wafer contacted against the pressing member.

According to claim 2, a transferring path of the pressing member is formed from a first transferring path and a second transferring path. The first transferring path is provided approximately along a direction to load and unload the wafer to the buffer cassette by the transfer equipment, and in a direction toward a center of the wafer in the buffer cassette. The second transferring path connects an edge of a side far away from the center of the wafer of the first transferring path, and an edge of an opening of the buffer cassette.

According to claim 3, an elastic member is adopted for the pressing member.

According to claim 4, a stopper limits a pressing force of the pressing member against the wafer stored in the buffer cassette.

According to claim 5, the buffer cassette includes a plurality of bins, and a sensor which detects a presence or an absence of the wafer in each bin by transferring along the plurality of bins. The sensor operates when the pressing member is located at the "pressing" position.

According to claim 6, the automated guided vehicle includes a transferring machine, a buffer cassette, and a pressing means which presses a flat object stored in the buffer cassette. The pressing means includes a stopper which limits the pressing force applied to the flat object.

According to claim 7, the pressing means includes a pressing member which contacts against the flat object. The pressing member can swing with an approximately center part of a longitudinal direction as a fulcrum.

According to claim 8, the pressing means includes a swing stopper which is formed from an elastic deformable member and which suppresses the swing of the pressing member by the weight of the pressing member itself.

According to claim 9, the automated guided vehicle includes a buffer cassette which has a plurality of bins for storing a wafer, and a single wafer transfer equipment which transfers the wafer. In addition, the automated guided vehicle includes a pressing member which presses the wafer stored in the buffer cassette from an opening of the cassette to an inner side. The automated guided vehicle also includes a sensor which detects a presence or an absence of the wafer stored in each of the bins by transferring along the plurality of bins.

According to claim 10, the pressing member also serves as means for preventing a jumping out of the wafer during transportation.

According to claim 11, the sensor is provided to the single wafer transfer equipment which includes an elevating and descending mechanism.

BRIEF DESCRIPTION OF THE DRAWINGS

FIG. 3 is a cross-sectional side view of a buffer cassette.

DETAILED DESCRIPTION OF THE PREFERRED EMBODIMENTS

An embodiment of the present invention will be described with reference to the drawings.

First, the entire structure of an automated guided vehicle 1 will be described. In the following description, a direction of an arrow F in FIG. 1 will be regarded as the front, and front, back, left, right positions of each structure will be described. Moreover, the front, back, left, right positions of each structure in other drawings are also the same as in FIG. 1.

Figure 1:
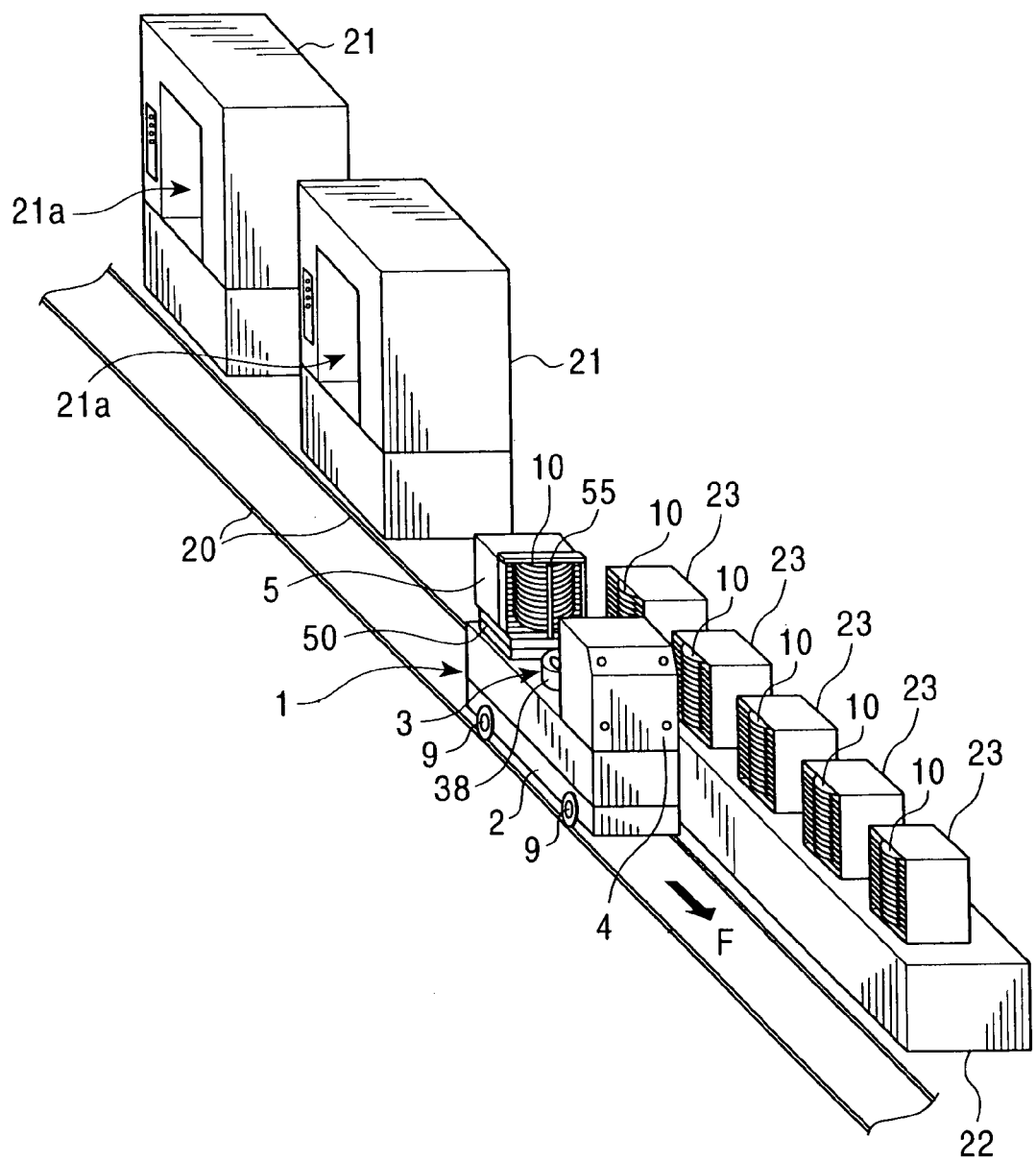
FIG. 1 is a perspective view showing an automated guided vehicle in a clean room.

As shown in FIG. 1, the automated guided vehicle 1 is a track guided vehicle which automatically travels on traveling rails 20·20. A vehicle main body 2 is supported by traveling wheels 9·9·9·9. The traveling wheels 9·9·9·9 are driven by each corresponding drive motors 8·8·8·8 (FIG. 2), and the vehicle main body 2 travels on the traveling rails 20·20 by four-wheel drive.

Further, in the present embodiment, to reduce slipping, the drive is propagated to all of the traveling wheels 9·9·9·9, and the drive motors 8·8·8·8 are provided for each of the traveling wheels 9·9·9·9 respectively. However, the mechanism to propagate the drive to all of the traveling wheels 9·9·9·9 is not limited to this example, and another mechanism can be adopted. Moreover, if the drive wheel is provided to both the front and the back of the vehicle, the number of wheels is not limited to four, and the number is not limited.

Processing equipments 21·21 . . . and a stocker 22 are provided along the traveling rails 20·20. A plurality of cassettes 23·23 . . . are arranged on the stocker 22 with a prescribed interval between one another. Each of the cassettes 23·23 . . . is provided with its opening facing toward the traveling rails 20·20 side. Each cassette 23 includes a plurality of bins which are provided vertically, and wafers 10·10 . . . are stored horizontally in each bin.

In the present embodiment, the stocker 22 is a one-story stocker. However, the stocker 22 can be an automated warehouse including an entrance and an exit for the cassette 23, a plurality of racks, and a stacker crane which transfers the cassette 23 between the rack, and the entrance and the exit.

Figure 2:
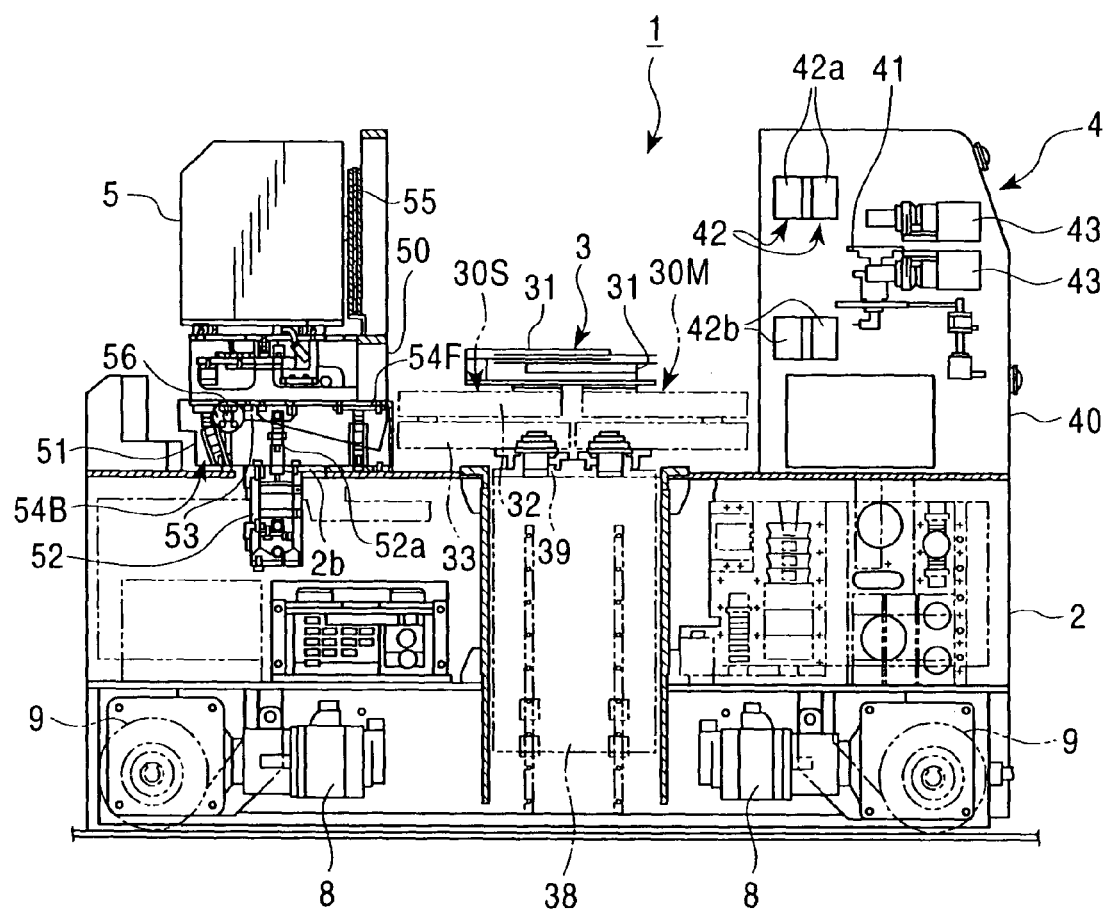
FIG. 2 is a cross-sectional side view of the automated guided vehicle.

As shown in FIG. 2, a transfer equipment 3 which transfers the wafers 10·10 . . . is provided at a center of the vehicle main body 2 of the automated guided vehicle 1. In the front and the back of the transfer equipment 3, a positioning device 4 and a buffer cassette 5 are provided. The positioning device 4 adjusts a direction and a center position of the wafers 10·10 . . . . The buffer cassette 5 stores the wafers 10·10 . . . .

Next, the transfer equipment 3 will be described.

The transfer equipment 3 includes transfer arms 30M·30S, a base 38, a turn table 39 or the like. The base 38 is embedded in the center of the vehicle main body 2. The turn table 39 is provided rotatable on the base 38. A pair of transfer arms 30M·30S are attached on the turn table 39.

The base 38 can elevate and descend. The turn table 39 can rotate relatively to the base 38. The transfer arm 30M (30S) is a scalar arm typed robot hand which includes a transfer hand 31, a first arm 32, a second arm 33, and a link mechanism. The transfer arm 30M (30S) is formed stretchable by an actuator formed from a servomotor or the like.

Next, the positioning device 4 will be described.

The positioning device 4 includes a casing 40, a place table 41, orientation flat sensors 42·42, an optical character reader (OCR) 43 or the like. The casing 40 has an opening at the transfer equipment 3 side. Two pairs of orientation flat sensors 42·42 are provided in proximity to the opening of the casing 40. Each pair of the orientation flat sensors 42·42 includes a projector 42a at a ceiling surface, and a light sensor 42b on a floor surface. The two pair of the orientation flat sensors 42·42 are formed such that to detect an orientation flat position (or notch position) of the 12 inch sized wafer 10 by the orientation flat sensor 42 located at an outer side (closer to the opening of the casing 40), and to detect an orientation flat position (or notch position) of 8 inch sized wafer 10 by the orientation flat sensor 42 located at an inner side (away from the opening of the casing 40).

Moreover, the OCR 43 is embedded to an inner side on the floor surface of the opening of the casing 40. The wafer 10 is set within the casing 40 with a face of the wafer 10 applied with an ID mark facing downward. The ID mark 11 is scanned by the OCR 43. Further, the wafer 10 can be set with the face of the ID mark facing upward. In this case, it is preferable to provide the OCR 43 at the inner side on the ceiling surface of the opening of the casing 40, or by considering a case in which a board face of the wafer 10 is reversed during an operation, as shown in FIG. 2, to provide a vertical pair of OCR 43·43 at the inner side on the ceiling surface and the floor surface of the opening of the casing 40.

Moreover, the place table 41 for placing the wafer 10 is provided on the floor surface of the opening of the casing 40. The place table 41 is a disk shaped, and a suction hole is provided at a center of rotation of the place table 41. A plurality of suction grooves are provided concentrically and radially from the suction hole. Under this structure, from a state in which the wafer 10 is placed on the place table 41, when the wafer 10 is sucked by an air pump from the suction hole, the wafer 10 is retained to the place table 41. Therefore, even when the place table 41 is rotated, the wafer 10 is not displaced by a centrifugal force.

Next, the buffer cassette 5 will be described.

As shown in FIG. 2 and FIG. 3, the buffer cassette 5 is fixed on a movable base member 50 with an opening which is an entrance of the wafer facing toward the front (transfer equipment 3 side). The movable base member 50 is provided on a base frame (not shown in the drawings) which is provided in standing state from the vehicle main body 2. A plurality of bins are provided vertically within the buffer cassette 5, and the wafers 10·10 . . . are stored on the bins.

When describing in a detail, the bins are protruding only slightly widthwise from the left and right inner surfaces in the buffer cassette 5. The bins support a lower surface of both ends of the wafer 10. The left-right width of each bin is formed slightly wider than a diameter of the wafer 10 with an appropriate margin. Therefore, even when the transfer hand 31 which sucks and retains the wafer 10 is displaced slightly in a lateral direction, or even when the wafer 10 is retained by the transfer hand 31 under a state in which the center of the wafer 10 and the center (left-right center) of the transfer hand 31 do not correspond to one another slightly, the wafer 10 can be inserted from the opening of the bin.

The left-right inner surfaces of the buffer cassette 5 are formed such that the left inner surface and the right inner surface are parallel to one another at the entrance side, and are gradually narrowed in a shape of letter V toward the inner side. Therefore, when the buffer cassette 5 is slanted by a mechanism to be described later on such that the inner side of the buffer cassette 5 becomes the lower side, the wafer 10 slides to the inner side by own weight, and both sides of the wafer 10 are guided to the part of the letter V. As a result, when the wafers 10 fall to the innermost part, the wafers 10 are arranged neatly at a position where the center of each of the wafers 10 and the left-right center of the buffer cassette 5 correspond to one another. Under this state, the edges of the wafer 10 are pressed by a stopper rod 55 to be described later on, and the automated guided vehicle 1 is traveled.

At a position to a rear end side of the lower surface of the movable base member 50, a rotation fulcrum shaft 56 is provided laterally as a center of the swing of the movable base member 50. The rotation fulcrum shaft 56 is supported by a rear part of a base frame (not shown in the drawings) that is provided on an upper surface of the vehicle main body. An air cylinder 52 as a slanting means is embedded in the vehicle main body 2 below the buffer cassette 5. A cylinder rod 52a is protruding within the base frame. An upper end of the cylinder rod 52a is connected rotatable to a bracket 53 which is fixed on a lower surface of the movable base member 50.

By operating the air cylinder 52 to advance and recede the cylinder rod 52a, the movable base member 50 is elevated/descended via the bracket 53. Accordingly, the movable base member 50 of the buffer cassette 5 can be slanted vertically via the rotation fulcrum shaft 56.

Further, by adopting the air cylinder 52 which operates by air as an actuator, it is considered for vibration to be not propagated to the wafers 10·10 . . . stored in the buffer cassette 5 as much as possible. That is, when transferring the wafers 10·10 . . . from the automated guided vehicle 1 to the processing equipment 21, the wafers 10·10 . . . are transferred with the face of the wafers 10·10 . . . facing a same direction at all times, and a speed of the inspection processing is improved. The positioning device 4 scans the ID mark of the wafers 10·10 . . . , and the orientation flat position (or notch position) of the wafers 10·10 . . . are arranged in one direction. Then, the wafers 10·10 . . . are stored into the buffer cassette 5 under the arranged state. As described above, to prevent the once arranged wafers 10·10 . . . from being displaced or rotated, the vibration that generates at the traveling of the vehicle is buffered by a function like an air spring of the air cylinder 52.

Figure 3A:
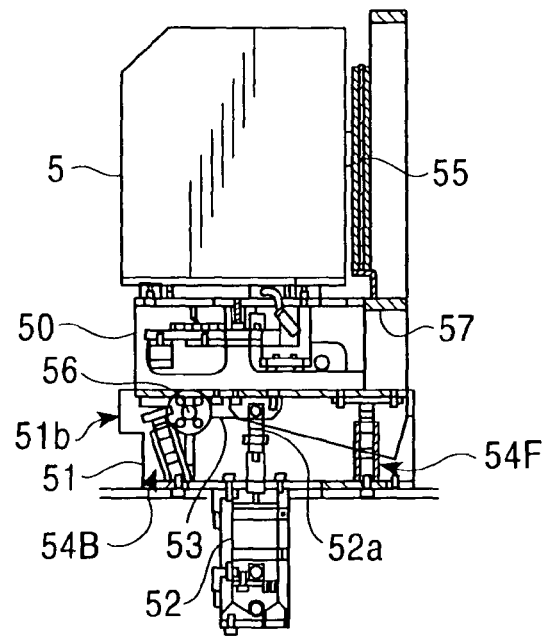
FIG. 3A shows the buffer cassette in a horizontal state.
Figure 3B:
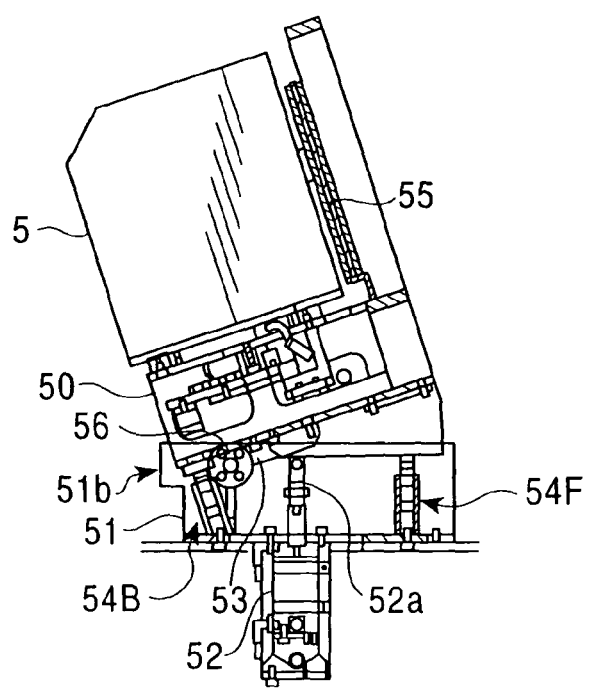
FIG. 3B shows the buffer cassette in a slanting state.

Moreover, a stopper mechanism 54F is provided at a front part of the inner side of the base frame, and a stopper mechanism 54B is provided at a back part of the inner side of the base frame. The stopper mechanisms 54F·54B regulate a horizontal state and a slanting state of the buffer cassette 5. In the present embodiment, the "horizontal state" indicates a position and a state of the buffer cassette 5 of when the bins where the wafers 10·10 . . . are placed become horizontal, as shown in FIG. 3A. The "slanting state" indicates a position and a state of the buffer cassette 5 of when the side of the entrance (front) of the bins slants upward, as shown in FIG. 3B.

The stopper rod 55 as a pressing member for pressing the edge of the wafers 10·10 . . . is provided in proximity to the opening of the buffer cassette 5. A guide hole 57a is formed from a left end position to a center position of a guide frame 57 provided laterally in proximity to the lower part of the entrance of the buffer cassette 5. A lower part of the stopper rod 55 is inserted with clearance to the guide hole 57a. The stopper rod 55 is transferable along the guide hole 57a.

When the automated guided vehicle 1 is under a stopped state, the stopper rod 55 is located at an edge of one side (in the present embodiment, the left edge) of the entrance of the buffer cassette 5. At the left end position ("receding" position), the stopper rod 55 is not an obstacle for loading and unloading the wafers 10·10 . . . and the wafers 10·10 . . . can be transferred.

When the transferring of the wafer 10 is completed and traveling the automated guided vehicle 1, (as described above, the buffer cassette 5 is slanted, and) the stopper rod 55 is slid to the left-right center position ("pressing" position) of the entrance of the buffer cassette 5, and the stopper rod 55 is contacted against the edge of the wafers 10·10 . . . to prevent the jumping out of the wafers 10·10 . . . .

Conventionally, the stopper rod 55 was transferred from the left end position toward the center position of the entrance of the buffer cassette 5 almost linearly. In other words, the stopper rod 55 transfers along the edge of the wafer 10 to slightly touch against the periphery of the wafer 10. The transferring direction of the stopper rod 55 is a tangent direction of the wafer 10. Even after the stopper rod 55 contacts against the wafer 10, the stopper rod 55 reaches the center position ("pressing" position) of the opening of the buffer cassette 5 while touching against the periphery of the wafer 10.

The wafer 10 is formed in a disk shape from a silicon single crystal having a thickness of approximately one millimeter. If the stopper rod 55 transfers by touching slightly against the periphery of the wafer 10, there are cases when the stopper rod 55 is cut off as if scrubbed against a sharp-edged tool. Even if the stopper rod 55 is not cut off, there are many cases when the surface of the stopper rod 55 is damaged. If the stopper rod 55 is scrubbed against the periphery of the wafer 10 continuously, there is a possibility for the stopper rod 55 to be cut off at last.

Therefore, in the present invention, the stopper rod 55 is formed as follows, and the durability of the stopper rod 55 is improved.

Figure 4:
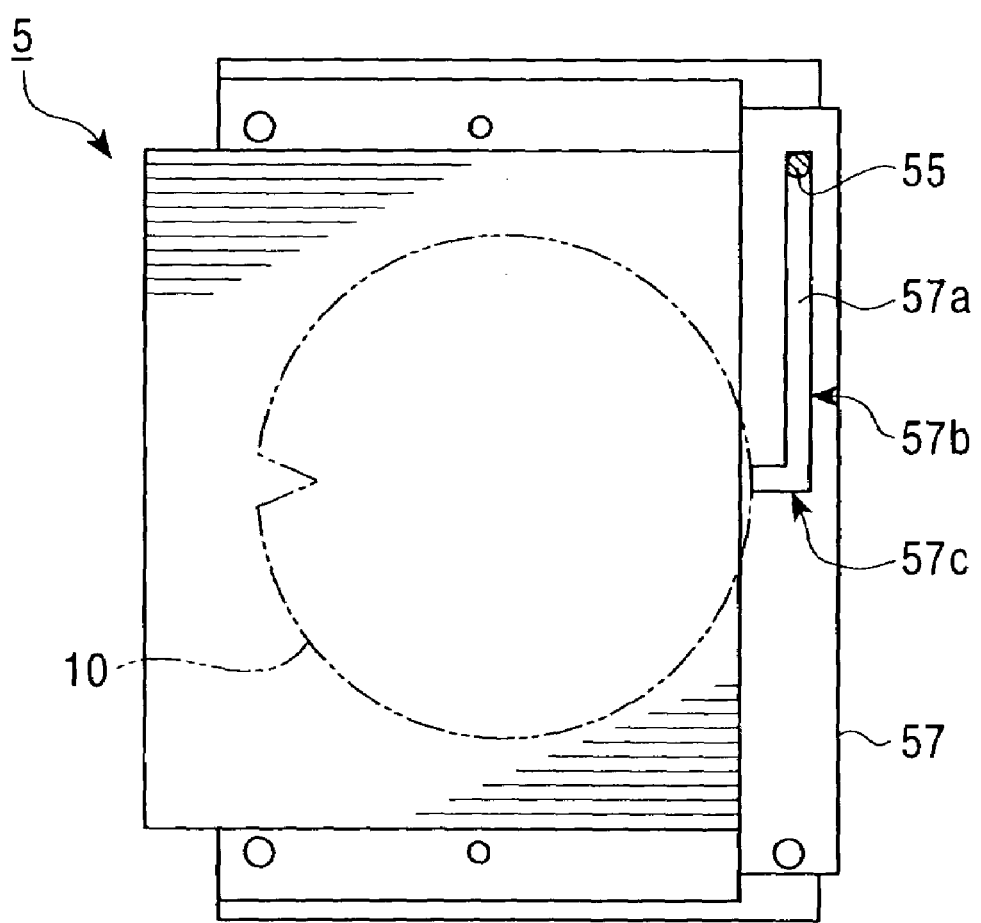
FIG. 4 is a cross-sectional plan view of the buffer cassette.

As shown in FIG. 4, the guide hole 57a formed on the guide frame 57 includes a longitudinal hole 57c and a lateral hole 57b. The longitudinal hole 57c is formed from the left-right center position of the buffer cassette 5 along a direction to load and unload the wafer 10 by the transfer equipment 3. The lateral hole 57b is connected to the front end of the longitudinal hole 57c, and is formed toward the left end position of the buffer cassette 5. The lower part of the stopper rod 55 is inserted to the guide hole 57a, and the stopper rod 55 can slide along the guide hole 57a.

Next, the mechanism for transferring the stopper rod 55 back and forth will be described. For example, a guide is provided along the lateral hole 57b, and an actuator such as an air cylinder or an electric cylinder which expands and contracts in the direction of the longitudinal hole 57c is provided movable to the guide. In addition, the stopper rod 55 is attached to the actuator. The actuator is transferred along the guide by a drive mechanism such as a different actuator or a belt. Under this structure, by operating the drive mechanism, the stopper rod 55 can transfer along the lateral hole 57b. In addition, by operating by the actuator, the stopper rod 55 can transfer back and forth along the longitudinal hole 57c.

The stopper rod 55 is formed from an elastic member such as an electrically semiconductive elastomer or a polyethylene foam, which has characteristic of a shock absorber, electrical conductive property, and durability. Moreover, a surface of a metal axel or the like can be covered by these elastic members to form the stopper rod 55.

Next, an operation to contact the stopper rod 55 against the wafer 10 after the transferring of the wafer 10 to the buffer cassette 5 has been completed under the above-described structure will be described.

When the wafer 10 is being transferred into the buffer cassette 5, the stopper rod 55 is receded to a left end position ("receding" position) of the opening of the buffer cassette 5. After the transferring of the wafer 10 is completed, the stopper rod 55 located at the "receding" position transfers to a "pressing" position. In this case, the stopper rod 55 transfers in two stages, wherein a first stage is sliding to the right side along the lateral hole 57b, and a second stage is sliding backward along the longitudinal hole 57c after the first stage.

Figure 5:
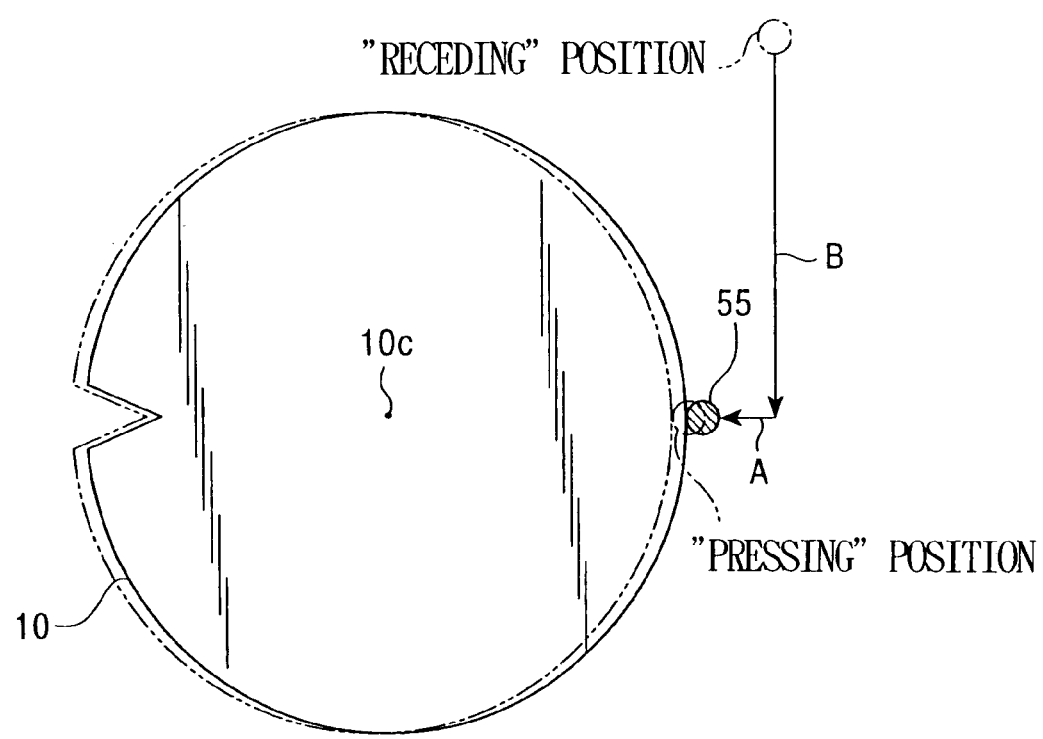
FIG. 5 is a plan view for describing a movement path of a stopper rod.

In other words, as shown in FIG. 5, the transferring path of the stopper rod 55 is formed from a first transferring path A and a second transferring path B. The first transferring path A is provided approximately along a direction to load and unload the wafer 10 to the buffer cassette 5 by the transfer equipment 3, and in a direction to approach a center 10c of the wafer 10 within the buffer cassette 5. The second transferring path B connects an edge of a side far away from the center 10c of the wafer 10 of the first transferring path A, and the left edge of the opening of the buffer cassette 5. Further, the first transferring path A corresponds to the longitudinal hole 57c, and the second transferring path B corresponds to the lateral hole 57b.

FIG. 5 shows a moment when the stopper rod 55 located at the "receding" position transferred to the "pressing" position to contact against the edge of the wafer 10. At this time, the transferring direction of the stopper rod 55 is a direction shown with an arrow A in FIG. 5. The transferring direction of the stopper rod 55 is perpendicular to an outline of a part of the wafer 10 to be contacted against the stopper rod 55. As a result, the damage applied to the stopper rod 55 by the peripheral edge of the wafer 10 can be reduced considerably, and the durability of the stopper rod 55 is improved.

Even after the stopper rod 55 contacts against the wafer 10, the stopper rod 55 further pushes the wafer 10 to an inner side (rear side) of the buffer cassette 5 so that the position of the wafer 10 is arranged accurately to the buffer cassette 5 (centering). Further, the stopper rod 55 has a shock absorption property, and can absorb a shock of when contacting against the wafers 10·10 . . . . As described above, since the wafers 10·10 . . . are pressed by the stopper rod 55, even when a shake is propagated to the wafers 10·10 . . . during the traveling of the automated guided vehicle 1, the wafer 10 is not rotated or displaced. The stopper rod 55 has an electrical conductive property as described above, and even when the wafers 10·10 . . . are charged with static electricity, the stopper rod 55 can release the electricity by contacting against the wafers 10·10 . . . .

In the above-described embodiment, the buffer cassette 5 is slanted, and with the opening of the buffer cassette 5 facing diagonally upward, the stopper rod 55 is transferred to the center position of the opening. By taking two steps, the wafers 10·10 . . . are reliably prevented from jumping out from the opening.

The wafer 10 can be prevented from jumping out just by sliding the stopper rod 55 to the center position of the buffer cassette 5 which is positioned in a horizontal state, and not in a slanting state. In addition, by pushing the wafer 10 against the part having a shape of the letter V (right and left inner walls), the position of the wafer 10 is adjusted (centering). This structure can abbreviate a structure for the buffer cassette 5 to be movable in a slanting state (in other words, the air cylinder 52, etc.). Therefore, the structure can be simplified, and the manufacturing cost can be reduced.

Next, a second embodiment of the present invention will be described with reference to the accompanying drawings.

First, a structure of the automated guided vehicle of the second embodiment will be described briefly.

Figure 6:
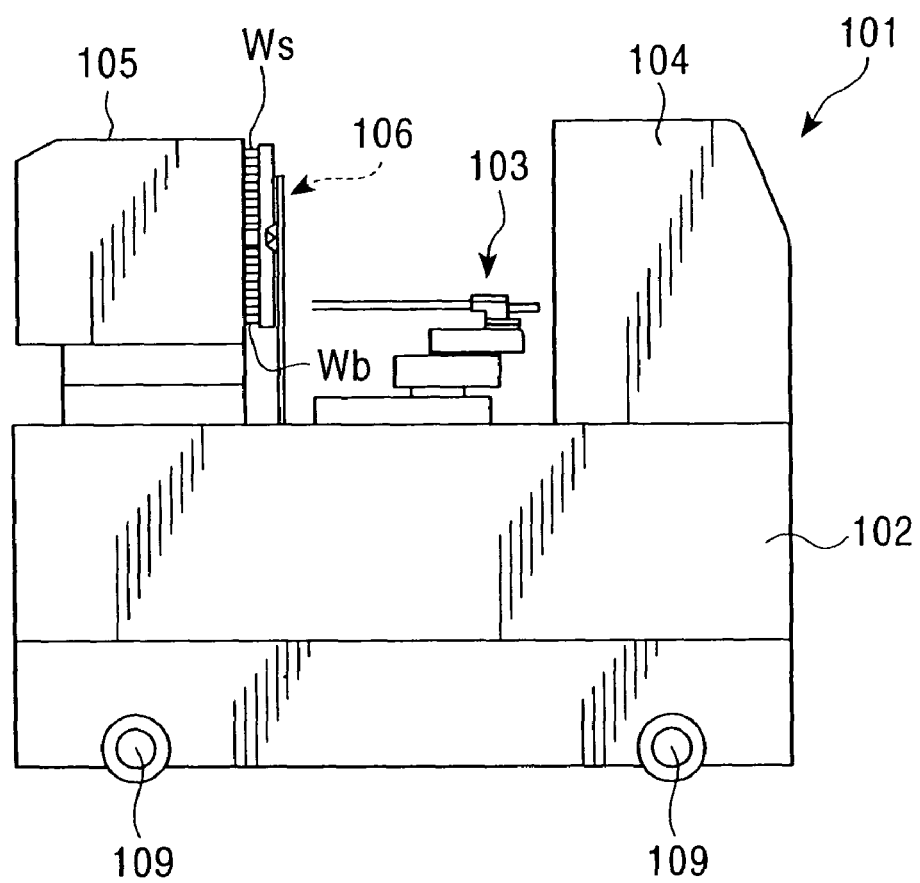
FIG. 6 is a side view showing the automated guided vehicle of the present invention.

In the automated guided vehicle 101 shown in FIG. 6, a buffer cassette 105 which can store a plurality of wafers Wb·Ws formed from a silicon single crystal or the like, a pressing means 106 of the wafers Wb·Ws, a transfer equipment 103 which transfers the wafers Wb·Ws, and a positioning device 104 which adjusts a direction, a position or the like of the wafers Wb·Ws, are provided in an upper part of a main body 102 which can travel by wheels 109·109 . . . . The automated guided vehicle 101 transports the wafers Wb·Ws stored in the buffer cassette 105 to a prescribed destination. Then, the wafers Wb·Ws are transferred one sheet at a time to a processing equipment or a stocker provided at the destination by the transfer equipment 103 formed as a single wafer transfer equipment.

Figure 7:
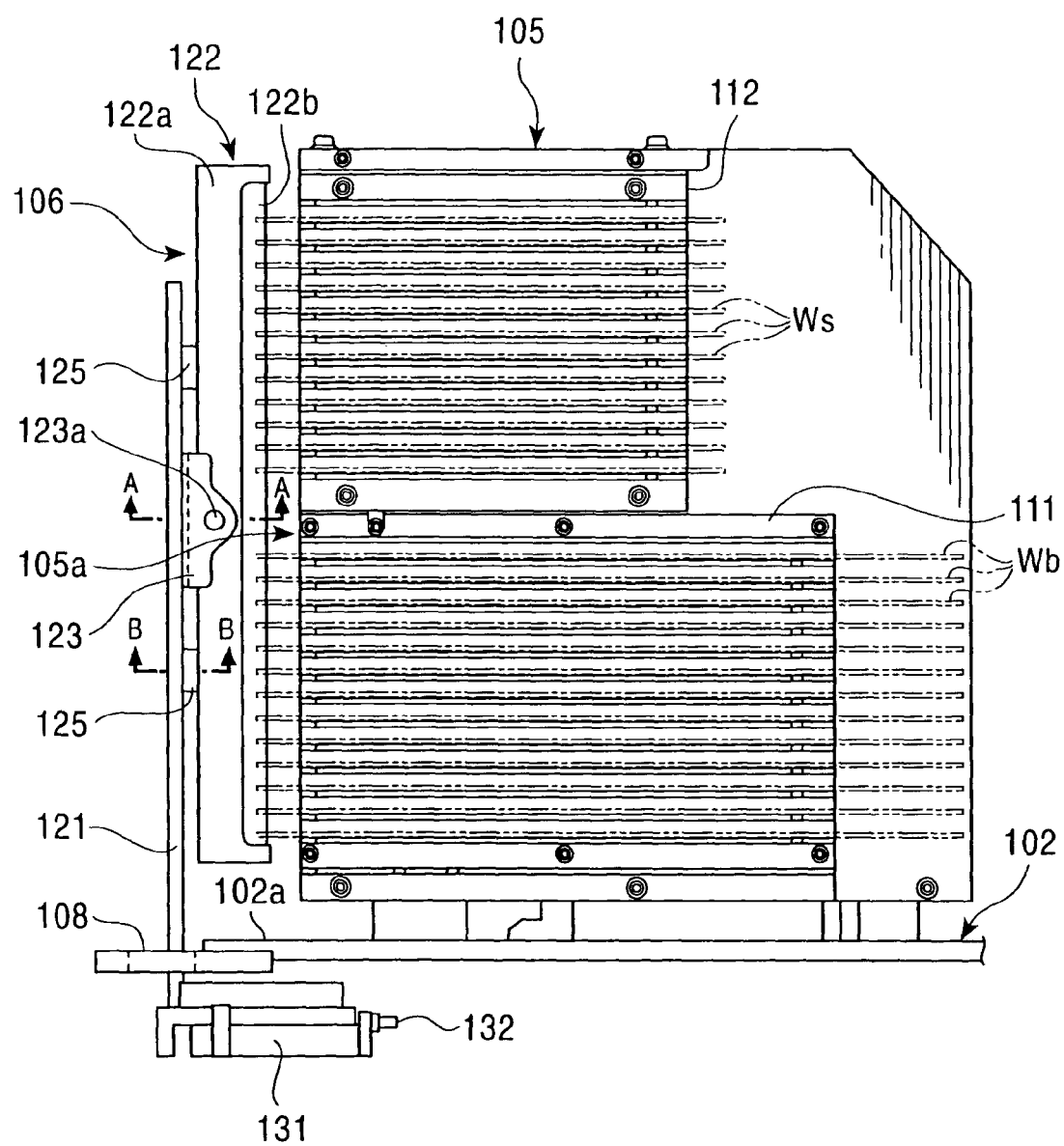
FIG. 7 is a side view showing the buffer cassette equipped in the automated guided vehicle.
Figure 8:
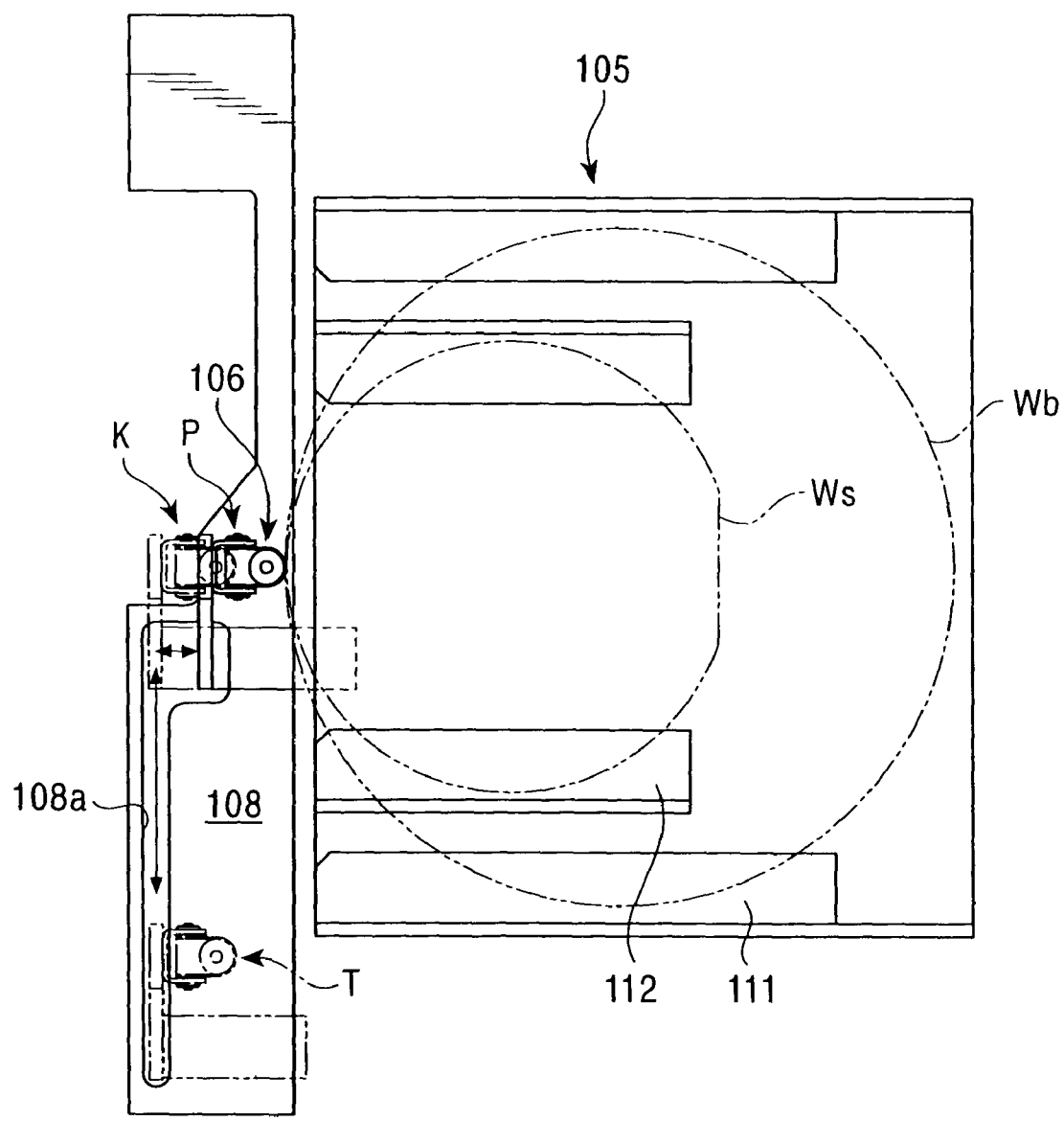
FIG. 8 is a plan view also showing the buffer cassette.
Figure 9:
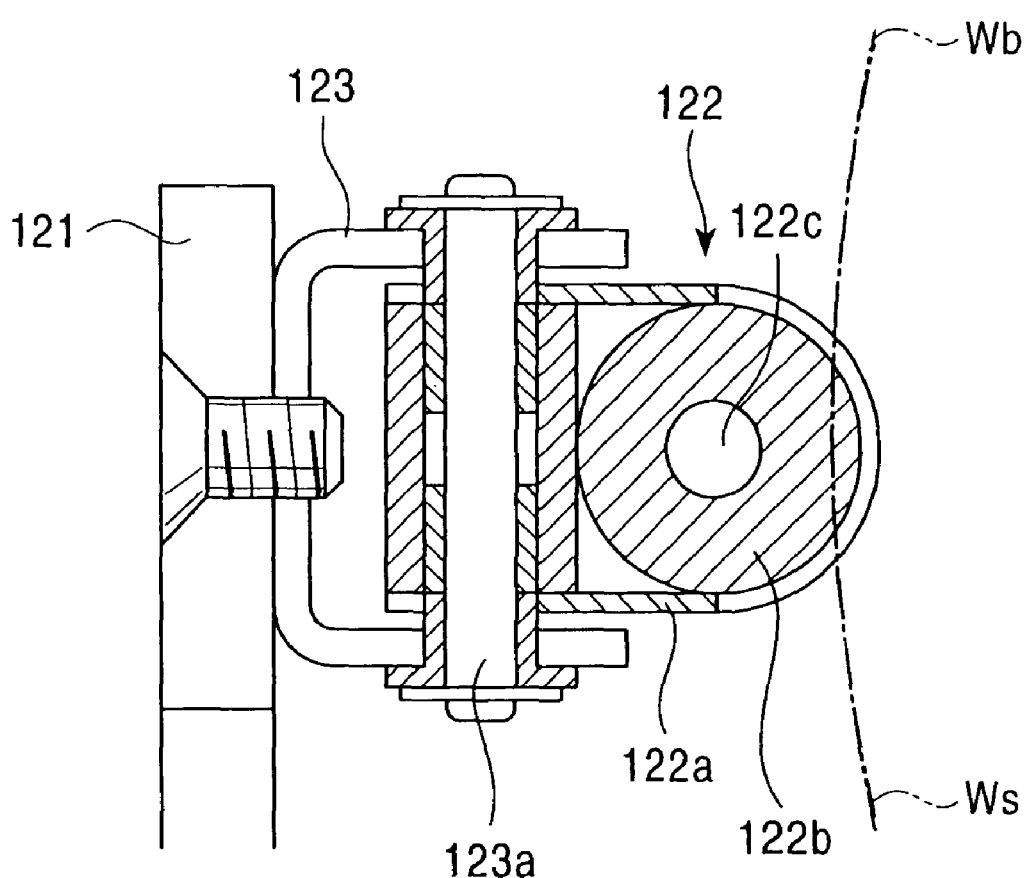
FIG. 9 is a cross-sectional view taken on line A—A in FIG. 7 showing a pressing means.

Next, a structure of the buffer cassette 105 and the pressing means 106 which are provided in the automated guided vehicle 101 will be described. As shown in FIG. 7 through FIG. 9, a lower cassette 111 is set in a lower part of the buffer cassette 105, and an upper cassette 112 is set in an upper part of the buffer cassette 105. The lower cassette 111 and the upper cassette 112 can store wafers of different sizes respectively. For example, the lower cassette 111 can store 12 inch sized wafers Wb, and the upper cassette 112 can store 8 inch sized wafers Ws. Moreover, the lower cassette 111 and the upper cassette 112 can store a plurality of wafers Wb·Ws in a stacked state with a prescribed interval between one another.

One of the sides of the buffer cassette 105 is opened to form an opening 105a. A pressing means 106 is provided in proximity to an outer side of the opening 105a (left side in FIG. 7). The pressing means 106 is formed from a column 121 which protrudes upward from a placing surface 102a of the buffer cassette 105, and a pressing member 122 which is supported by the column 121.

The pressing member 122 is formed in a long shape which is long in a vertical direction. A supporting member 123 fixed to the column 121 supports an approximately a center part of the pressing member 122 in the vertical direction such that the pressing member 122 can swing. Moreover, the pressing member 122 includes an elastic member 122 which is formed from an elastomer or the like for pressing the wafers Wb·Ws, and a retention member 122a which retains the elastic member 122b. The elastic member 122b has a length which can cover a range wider than a storage range of the wafers Wb·Ws in the vertical direction. Therefore, the elastic member 122b can press all of the wafers Wb·Ws loaded fully in the lower cassette 111 and the upper cassette 112.

A switching between a pressed state and a released state of the wafers Wb·Ws by the pressing member 122 is carried out by an expansion and contraction movement of a cylinder 131 provided at a lower end of the column 121. For example, when the cylinder 131 is contacted and the pressing member 122 is moved to the buffer cassette 105 side, it becomes under the pressed state. When the cylinder 131 is expanded and the pressing member 122 is moved to an opposite side of the buffer cassette 105, it becomes under the released state. When pressing the wafers Wb·Ws by the pressing member 122, from a state in which the elastic member 122b is contacting against an edge surface of the wafers Wb·Ws, the pressing member 122 is transferred to the wafers Wb·Ws side by a prescribed measurement. Then, the wafers Wb·Ws are pushed into the elastic member 122b, and the wafers Wb·Ws are pressed by the elastic force of the elastic member 122b.

However, when a transferring amount of the pressing member 122 to the buffer cassette 105 side becomes excessively large, a force applied to the wafers Wb·Ws becomes excessively large. As a result, especially when the number of stored wafers Wb·Ws is small, there is a possibility for the wafers Wb·Ws to be damaged.

Therefore, a cylinder stopper 132 is provided to the cylinder 131 to control an amount of expansion and contraction of the cylinder 131. In the second embodiment, the amount of contraction of the cylinder 131 is controlled to be in a prescribed measurement by the cylinder stopper 132 such that the amount the pressing member 122 is pushed into the wafers Wb·Ws does not exceed a prescribed measurement. Accordingly, an excessive force can be prevented from being applied to the wafers Wb·Ws, and the wafers Wb·Ws can be prevented from being damaged.

The pressing means 106 formed as described above is transferable along a guide hole 108a having a shape of letter L which is formed in a guide plate 108. When not pressing the wafers Wb·Ws, for example, when transferring the wafers Wb·Ws stored in the buffer cassette 105 by the transfer equipment 103, the pressing means 106 is located at a standby position T at one side of the buffer cassette 105.

When the automated guided vehicle 101 transfers for transporting the wafers Wb·Ws, the pressing means 106 transfers to a pressing position P to press the wafers Wb·Ws.

At a position in the longitudinal direction of the buffer cassette 105 (left-right direction in FIG. 7, FIG. 8), the standby position T is located away from the buffer cassette 105 than the pressing position P. The pressing means 106 located at the standby position T transfers from the standby position T at one side of the buffer cassette 105 to a pressing releasing position K at a left-right (top-bottom in FIG. 8) center part. Then, the pressing means 106 transfers to the pressing position P at the buffer cassette 105 side to press the wafers Wb·Ws. As described above, the pressing means 106 transfers in the shape of letter L along the guide hole 108a.

A switching between the released state wherein the pressing means 106 is located at the pressing releasing position K of the left-right center part, and the pressed state wherein the pressing means 106 is located at the pressing position P, is carried out by an expansion and contraction movement of the cylinder 131 provided at the lower end of the column 121. When the cylinder 131 is contracted and the pressing member 122 is transferred to the buffer cassette 105 side, it becomes under the pressed state. When the cylinder 131 is expanded and the pressing member 122 is transferred to the opposite side of the buffer cassette 105, the pressed state is released. When pressing the wafers Wb·Ws by the pressing member 122, from a state in which the elastic member 122b is contacting against an edge surface of the wafers Wb·Ws, the pressing member 122 is transferred to the wafers Wb·Ws side by a prescribed measurement. Then, the wafers Wb·Ws are pushed into the elastic member 122b, and the wafers Wb·Ws are pressed by an elastic force of the elastic member 122b.

As described above, by forming the pressing means 106 to transfer to the left-right center part and then to press the wafers Wb·Ws, the damage such as the elastic member 122b being cut off by contacting against the wafers Wb·Ws like when the pressing member 106 is formed to transfer directly from the pressing position P to a left-right direction, can be prevented from generating.

Figure 10:
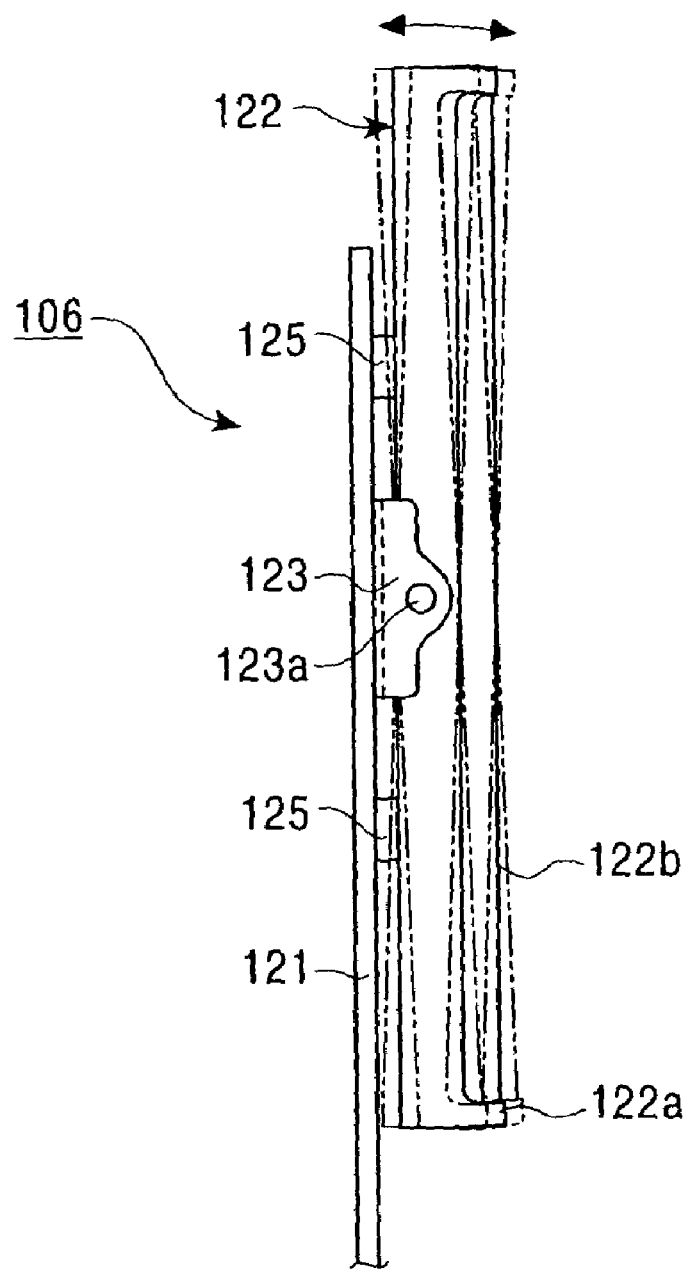
FIG. 10 is a side view showing a state in which the pressing means can swing.
Figure 11:
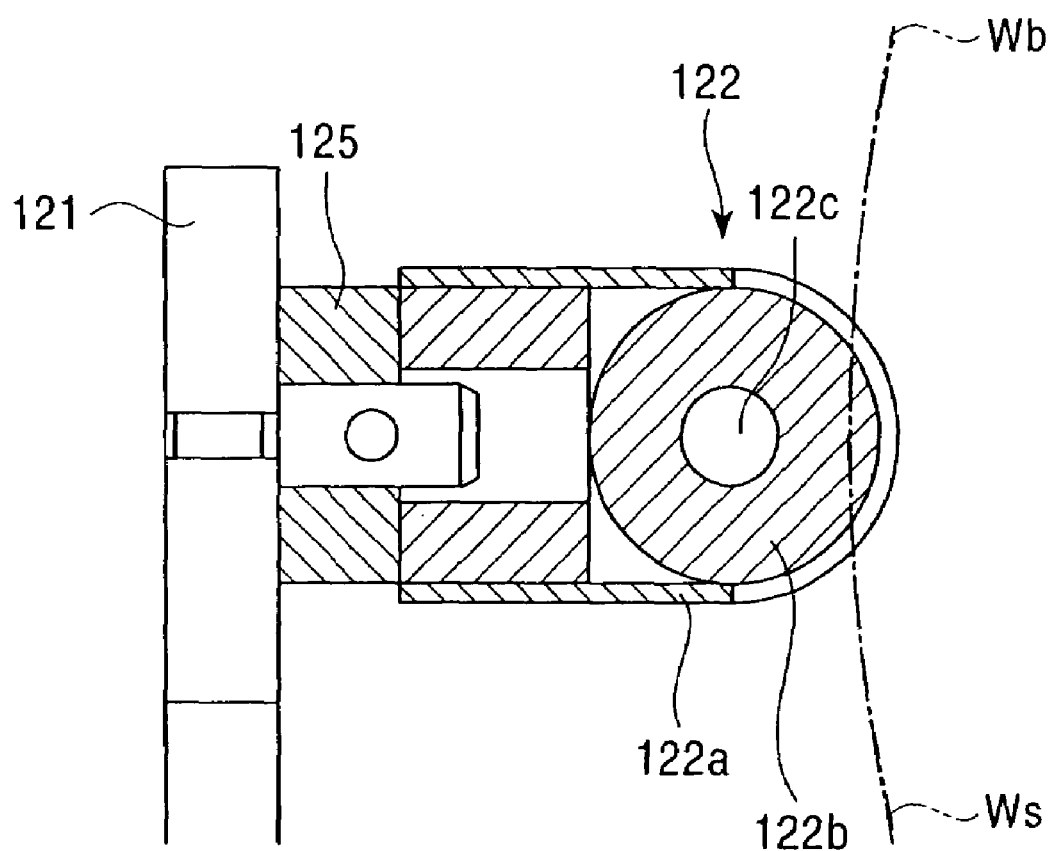
FIG. 11 is a cross-sectional view taken on line B—B in FIG. 7 showing the pressing means.

Moreover, as shown in FIG. 10 and FIG. 11, the pressing member 122 can swing with a part supported by the supporting member 123 as the center. The range of swing is controlled by swing stoppers 125·125 which are mounted to the column 121 at an upper part and a lower part of the supporting member 123. The swing stoppers 125·125 provided between the column 121 and the pressing member 122 are formed by an elastomer, etc. like the elastic member 122b. The swing stoppers 125·125 contact against the pressing member 122 to restrict the pressing member 122 from swinging freely.

Accordingly, when a force is not applied to the pressing member 122 from the outside, the pressing member 122 is maintained under approximately vertical state. Then, when a force larger than the elastic force of the swing stopper 125 is applied to a swing direction of the pressing member 122 at a position higher or lower than the supporting member 123, the pressing member 122 swings.

Figure 12:
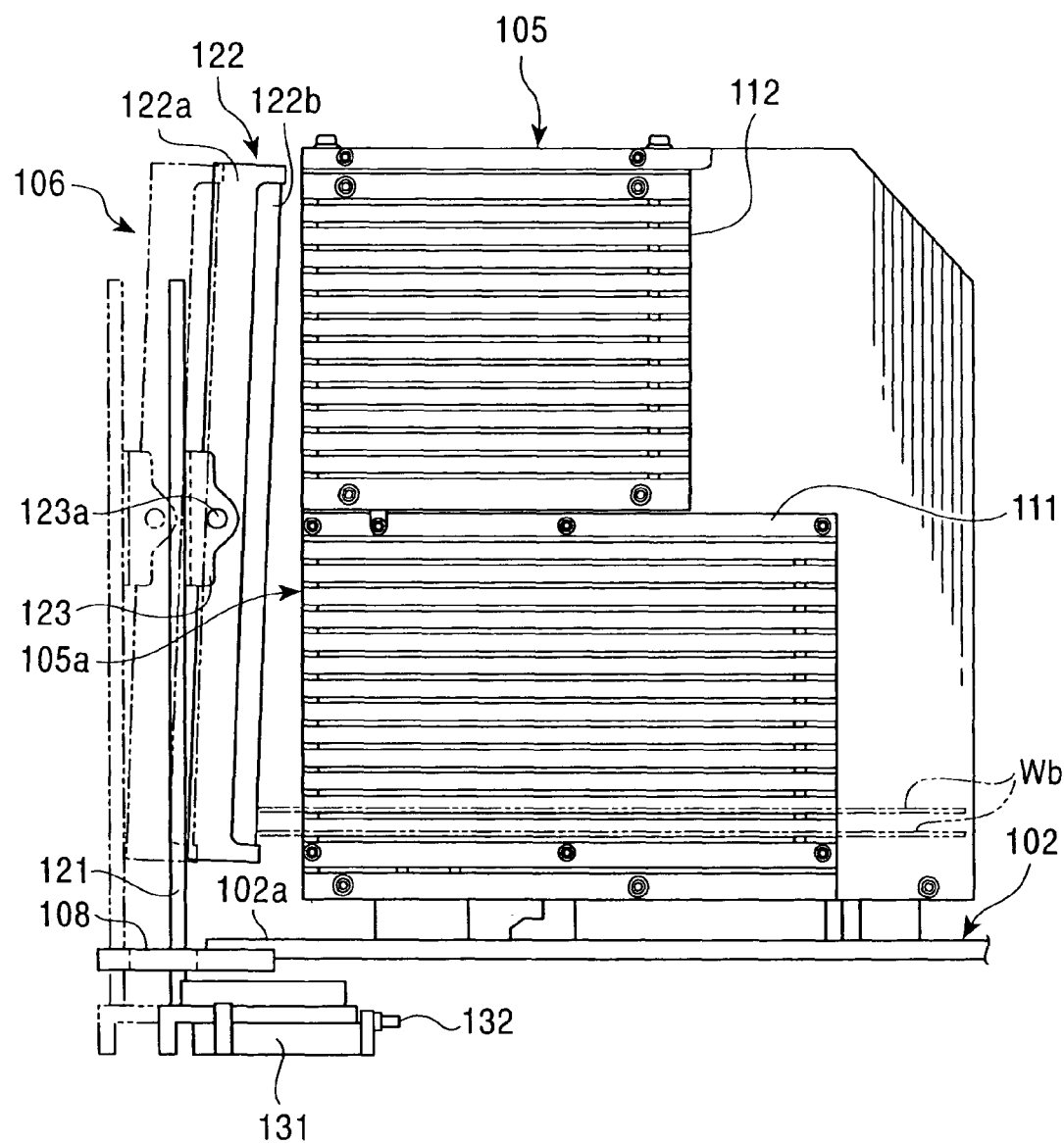
FIG. 12 is a side view showing a position of the pressing member when there is no swing stopper.

For example, when considering a case in which the swing stoppers 125·125 are not provided, since the pressing member 122 is supported by the supporting member 123 at a side opposite to the buffer cassette 105 in the longitudinal direction as shown in FIG. 12, if the pressing member 122 can swing freely, the upper part of the pressing member 122 slants toward a direction to approach the buffer cassette 105 by own weight.

As described above, if the pressing member 122 is slanted, in the case only several sheets of the wafers Wb are stored in the lower part of the lower cassette 111 of the buffer cassette 105, even when the cylinder 131 contracts and the pressing member 122 is transferred to the buffer cassette 105 side, since the amount of contraction of the cylinder 131 is controlled by the cylinder stopper 132, a gap generates between the wafer Wb and the lower part of the pressing member 122, and the wafer Wb cannot be pressed. In this case, for example, it can be considered to prevent the pressing member 122 from slanting by own weight by reducing the gap between the supporting member 123 and the pressing member 122 which is supported rotatable by the supporting member 123 such that a friction force between the supporting member 123 and the pressing member 122 becomes large.

However, under such a structure, when the pressing member 122 contacts against the wafers Wb·Ws, there is a possibility for a long period of time to be taken for adjusting the frictional force between the supporting member 123 and the pressing member 122 such that the pressing member 122 can be slanted without applying strong force to the wafers Wb·Ws. Therefore, as described above, by forming so that the pressing member 122 maintains a vertical state by the swing stoppers 125·125 without being slanted by own weight, even when only several sheets of the wafers Wb are stored, the wafers Wb can be pressed easily and reliably.

Figure 13:
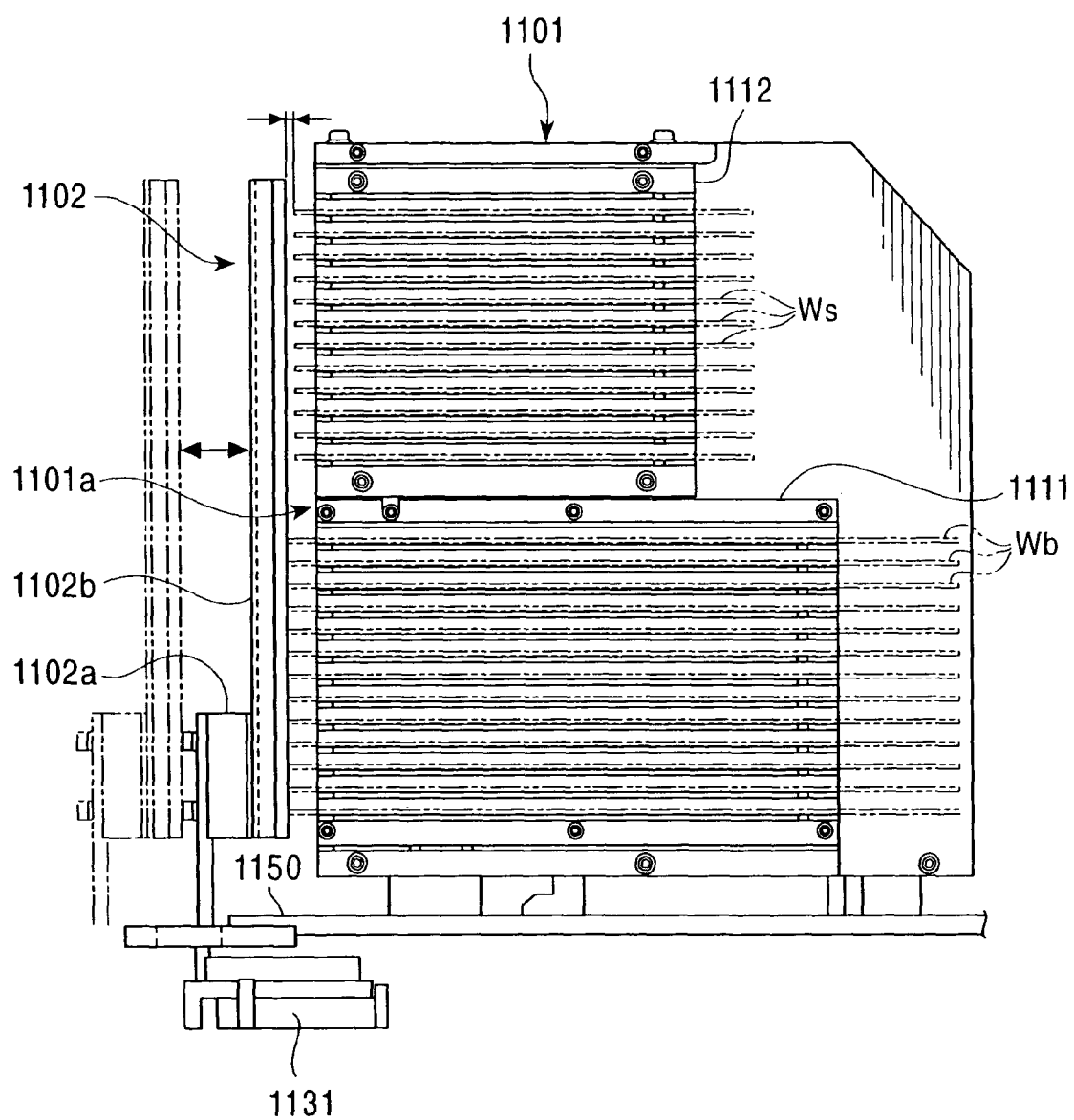
FIG. 13 is a side view showing the conventional buffer cassette.
Figure 14:
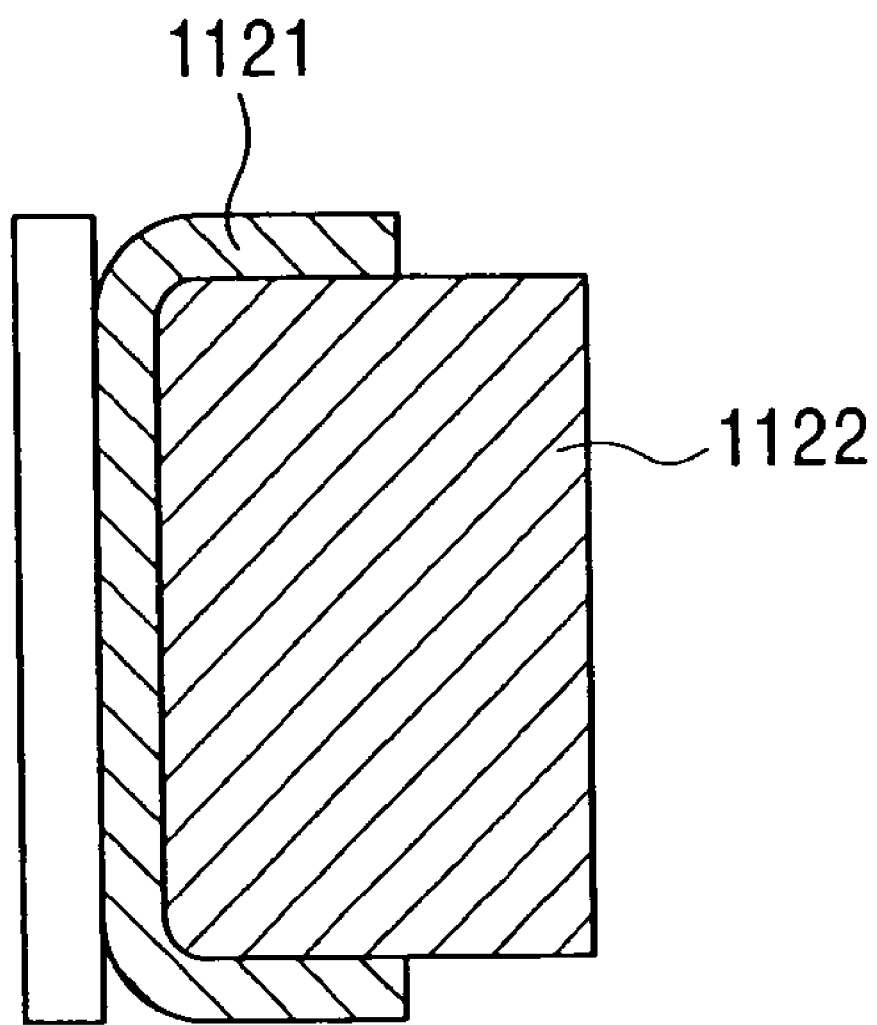
FIG. 14 is a plan view showing the conventional pressing means.

Meanwhile, as shown in FIG. 13, when the protruding amount of the wafer Wb stored in the lower cassette 111 from the buffer cassette 105 is larger than the protruding amount of the wafer Ws stored in the upper cassette 112 from the buffer cassette 105, the pressing member 122 transfers to the buffer cassette 105 side, and contacts against the wafer Wb of the lower cassette 111. Then, when the pressing member 122 transfers further to the buffer cassette 105 side, the swing stopper 125 of the lower side elastically deforms, and the pressing member 122 swings in a direction such that the upper part of the pressing member 122 approaches the buffer cassette 105. Accordingly, the wafer Ws of the upper cassette 112 is also pressed by the pressing member 122.

As described above, by forming the pressing member 122 to be capable of swinging, and controlling the swing movement of the pressing member 122 by the swing stopper 125, for example, even when the protruding amounts of the wafers Wb·Ws stored in the buffer cassette 105 from the buffer cassette 105 are different, or when the number of stored wafers Wb·Ws is small, all of the wafers Wb·Ws can be pressed reliably.

Further, a hollow 122c is formed inside the elastic member 122b such that when the wafers Wb·Ws are pressed against the elastic member 122b under the same strength, a dent degree of the elastic member 122b with the hollow 122c becomes larger than that of the elastic member 122b without the hollow 122c. Accordingly, it becomes possible for the wafers Wb·Ws to be pushed far into the elastic member 122b. As a result, a range in the longitudinal direction where the wafers Wb·Ws can be pressed can be enlarged. Even when the difference between the protruding amounts of the wafers Wb·Ws from the buffer cassette 105 is large, the wafers Wb·Ws can be pressed reliably.

Next, a third embodiment of the present embodiment will be described.

Figure 15:
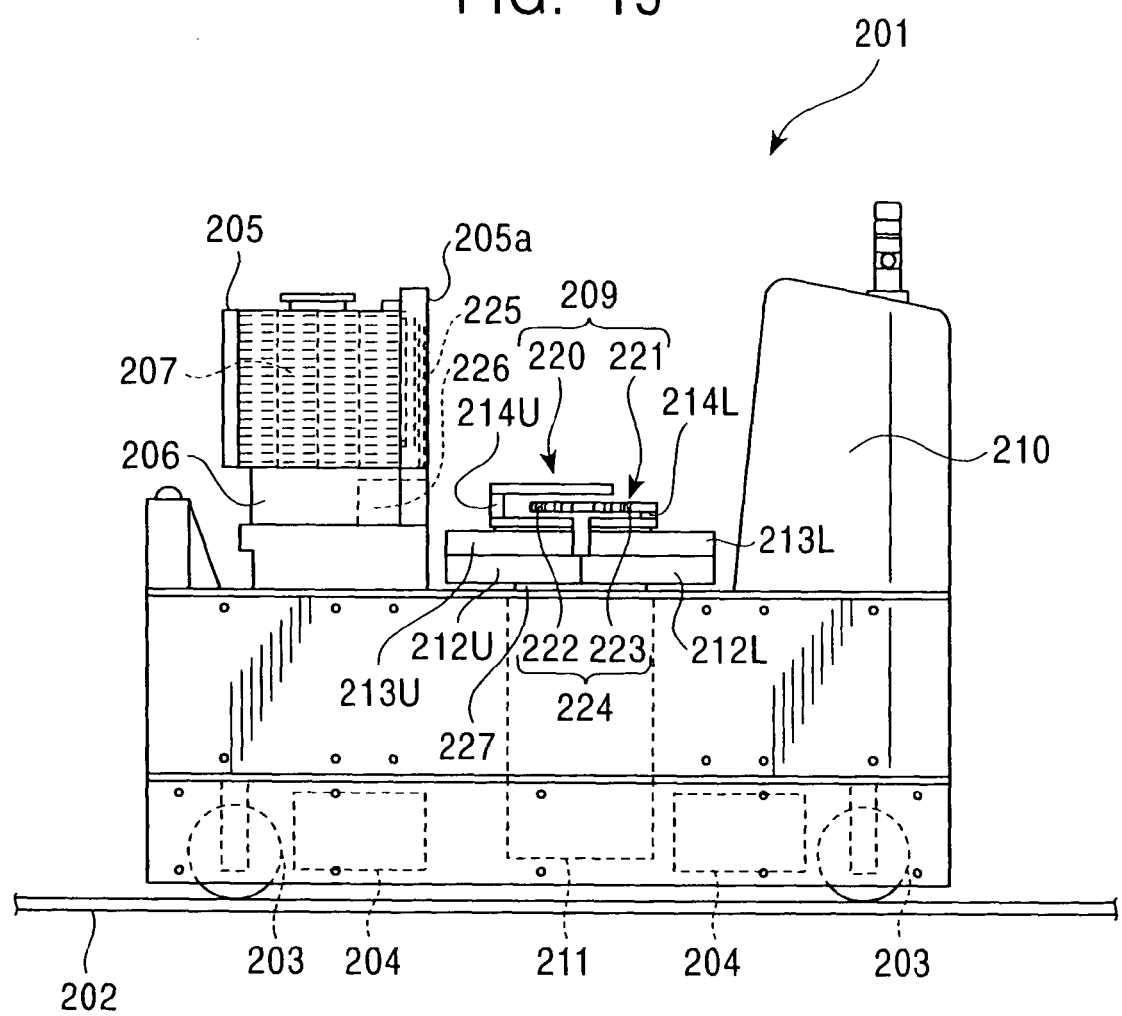
FIG. 15 is a side view of the automated guided vehicle.
Figure 16:
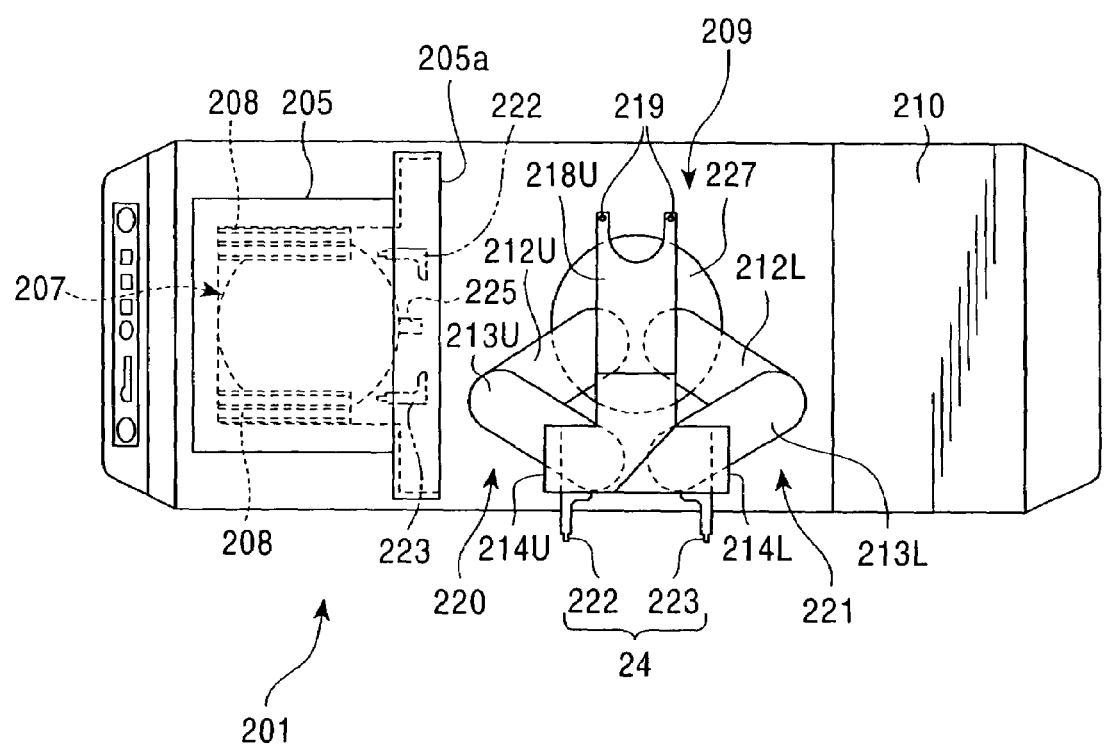
FIG. 16 is a plan view of the automated guided vehicle.

First, the entire structure of an automated guided vehicle 201 of the third embodiment will be described with reference to FIG. 15 and FIG. 16. Further, from the aspect of the present invention, an embodiment of the present invention can be applied to an automated guided vehicle which does not have traveling rails and which is guided by a guide wire or a laser guide device.

The automated guided vehicle 201 is a track guided vehicle which travels on two traveling rails 202·202 laid in a clean room. The automated guided vehicle 201 is supplied with electricity in a non-contacting state by an electric supply line (not shown in the drawings) provided in one of the traveling rails 202, and the electricity is supplied to drive motors 204·204 . . . which drives traveling wheels 203·203 . . . . A buffer cassette table 206 is provided on a rear part of the upper surface of the automated guided vehicle 201. The buffer cassette 205 is mounted detachable on the upper surface of the buffer cassette table 206 with an opening 205a of the buffer cassette 205 facing toward a front of the automated guided vehicle 201. Further, for convenience in the description, in the automated guided vehicle 201, the side where the buffer cassette 205 is provided will be regarded as a rear side, and the side where an aligner 210 to be described later on is provided will be regarded as a front side. Moreover, a plurality of left-right pair of bins 208·208 . . . (slashed line part in FIG. 16) which can store a plurality of wafers 207·207 . . . vertically are formed at the left and right inner sides of the buffer cassette 205. The bins 208·208 . . . are provided to protrude from the left and right side walls within the buffer cassette 205. By supporting the edges of the wafers 207·207 . . . by the bins 208·208 . . . , a plurality of wafers 207·207 . . . can be stored in the buffer cassette 205 without contacting against one another.

A single wafer transfer equipment 209 is provided to the front of the buffer cassette 205, and the aligner (positioning device) 210 is provided further to the front. The detail of the single wafer transfer equipment 209 will be described later on. The single wafer transfer equipment 209 takes out the wafers 207 stored in the buffer cassette 205 one sheet at a time. Then, the aligner 210 adjusts a suction position of the single wafer transfer equipment 209 such that a crystal orientation of the wafer 207 faces one direction. Consequently, the wafer 207 is transferred to a processing equipment such as a semiconductor manufacturing device or a wafer inspecting device. The single wafer transfer equipment 209 transfers the wafer 207 processed by the processing equipment to an empty bin 208 in the buffer cassette 205. Moreover, the aligner 210 includes an ID reader (not shown in the drawings) which scans a manufacturing history information such as a bar code indicated on a surface of each wafer 207.

Further, in the third embodiment, the automated guided vehicle 201 includes the aligner 210. However, the automated guided vehicle of the present invention can be not including an aligner.

Figure 17:
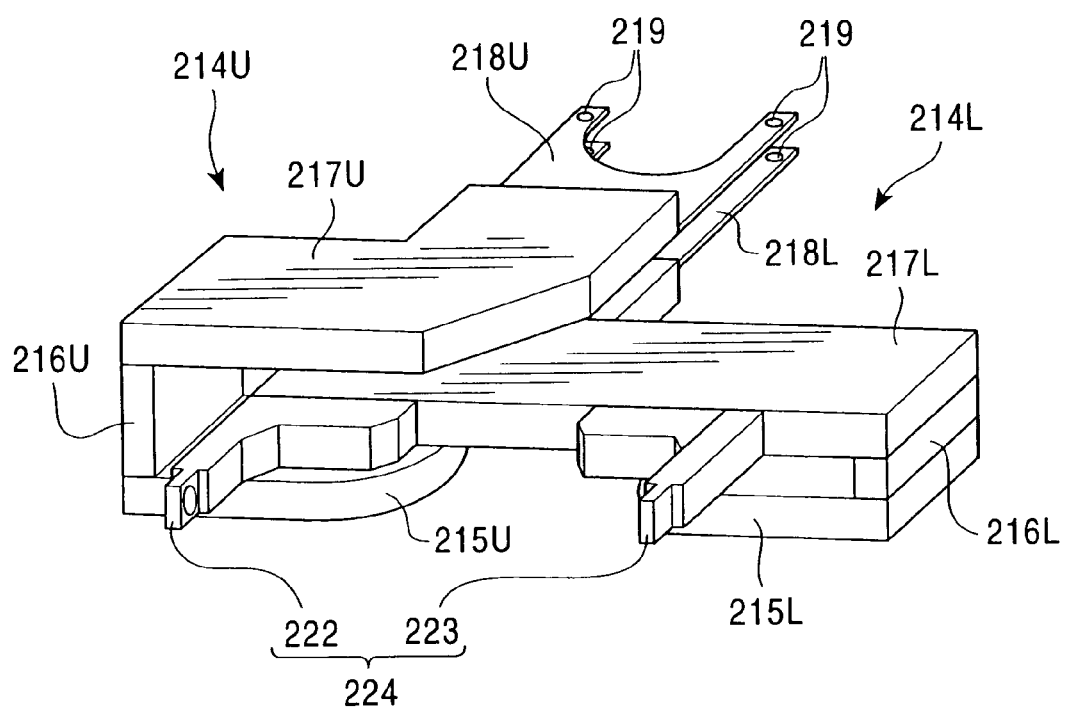
FIG. 17 is a partial perspective view of a single wafer transfer equipment.

Next, the single wafer transfer equipment 209 will be described with reference to FIG. 16, FIG. 17, and FIG. 18.

The base of the single wafer transfer equipment 209 is an elevating and descending mechanism 211. The elevating and descending mechanism 211 is provided capable of elevating and descending to the automated guided vehicle 201. A turn table 227 which can turn in relation to a main body of the elevating and descending mechanism 211 is provided on the upper end of the elevating and descending mechanism 211. Two transferring arms, an upper arm 220 and a lower arm 221, are provided on the turn table 227. By providing two transferring arms, the transfer work of the wafers 207·207 . . . (shown in FIG. 18) can be carried out speedily.

The upper arm 220 is formed from a first arm 212U, a second arm 213U, and an arm block 214U. One end of the first arm 212U is connected rotatable to the turn table 227, and the other end of the first arm 212U is connected rotatable to one end of the second arm 213U. Furthermore, the other end of the second arm 213U is connected rotatable to the arm block 214U. The upper arm 220 is formed such that when the first arm 212U rotates by an angle θ, the second arm 213U rotates by an angle −2θ which is a rotation in an opposite direction of the rotation of the first arm 212U, and the arm block 214U rotates by an angle θ in the same direction as the first arm 212U. Therefore, it seems that the arm block 214U carries out a linear motion.

The arm block 214U is formed from a lower plate 215U, a perpendicular part 216U, an upper plate 217U, and a pincette 218U. The lower plate 215U is a part which is connected rotatable to the second arm 213U. The perpendicular part 216U is protruding from an end of the lower plate 215U. One end of the upper plate 217U having a shape of approximately a letter L in a plan view is fixed on an upper end of the perpendicular part 216U. On the other end of upper plate 217U, the pincette 218U is provided. Suction holes 219·219 are drilled at an upper surface of the pincette 218U in proximity to the tip end of the pincette 218U. A negative pressure generation mechanism (not shown in the drawings), which is formed from an air compressor, an ejector or the like which are loaded to the automated guided vehicle 201, is connected to the suction holes 219·219 via an air tube.

By forming in such a way, a disk surface of the wafer 207 scooped on the pincette 218U is sucked onto the pincette 218U by an air suction from the suction holes 219·219. As a result, the wafer 207 does not fall off from the pincette 218U during the transferring. Moreover, by forming the pincette 218U in a thin plate form, the pincette 218U do not contact against a wafer other than the sucked wafer 207 when entering into the buffer cassette 205.

The lower arm 221 includes a first arm 212L, a second arm 213L, and an arm block 214L. The structure of the lower arm 221 is almost the same as the structure of the upper arm 220. However, as shown in FIG. 17, a height of a perpendicular part 216L of the lower arm 221 is lower than that of the perpendicular part 216U of the upper arm 220. The lower surface of the upper plate 217U of the upper arm 220 is always located at a position higher than the upper surface of the upper plate 217L of the lower arm 221. Therefore, the upper arm 220 and the lower arm 221 do not contact against one another.

Moreover, a mapping sensor 224, which is a transmissive light sensor having a projector 222 and a light sensor 223, is provided protruding from the rear surface of the upper plate 217L of the lower arm 221. The light such as an infrared light projected from a tip end of the projector 222 is received by a tip end of the light sensor 223.

Further, same effect can be obtained even if the positions where the projector 222 and the light sensor 223 are provided are reversed. Therefore, the present invention is not limited to this embodiment. Moreover, the mapping sensor 224 is not limited to the transmissive light sensor, and can be other sensor if the sensor can detect the presence or the absence of the wafer.

For example, in the case the system stops due to a power failure or the like and then recovers, when a worker carries out a maintenance to the inspecting device or the automated guided vehicle 201, if the system is recovered with the wafer on the wafer placing part of the inspecting device or the transfer equipment of the automated guided vehicle 201 left temporarily placed on an empty bin of the buffer cassette 205, there is a possibility for the automated guided vehicle 201 to be incorrectly recognizing the bin temporarily placed with the wafer as an empty bin. Therefore, it is necessary for the automated guided vehicle 201 to detect whether or not there is a wafer on each bin of the buffer cassette 205 immediately after the recovery to recognize again the presence or the absence of the wafer in each bin of the buffer cassette 205. When confirming the presence or the absence of the wafers 207·207 . . . stored in the buffer cassette 205, first, the single wafer transfer equipment 209 is rotated such that the mapping sensor 224 moves to a front side of the opening 205a of the buffer cassette 205.

Figure 18:
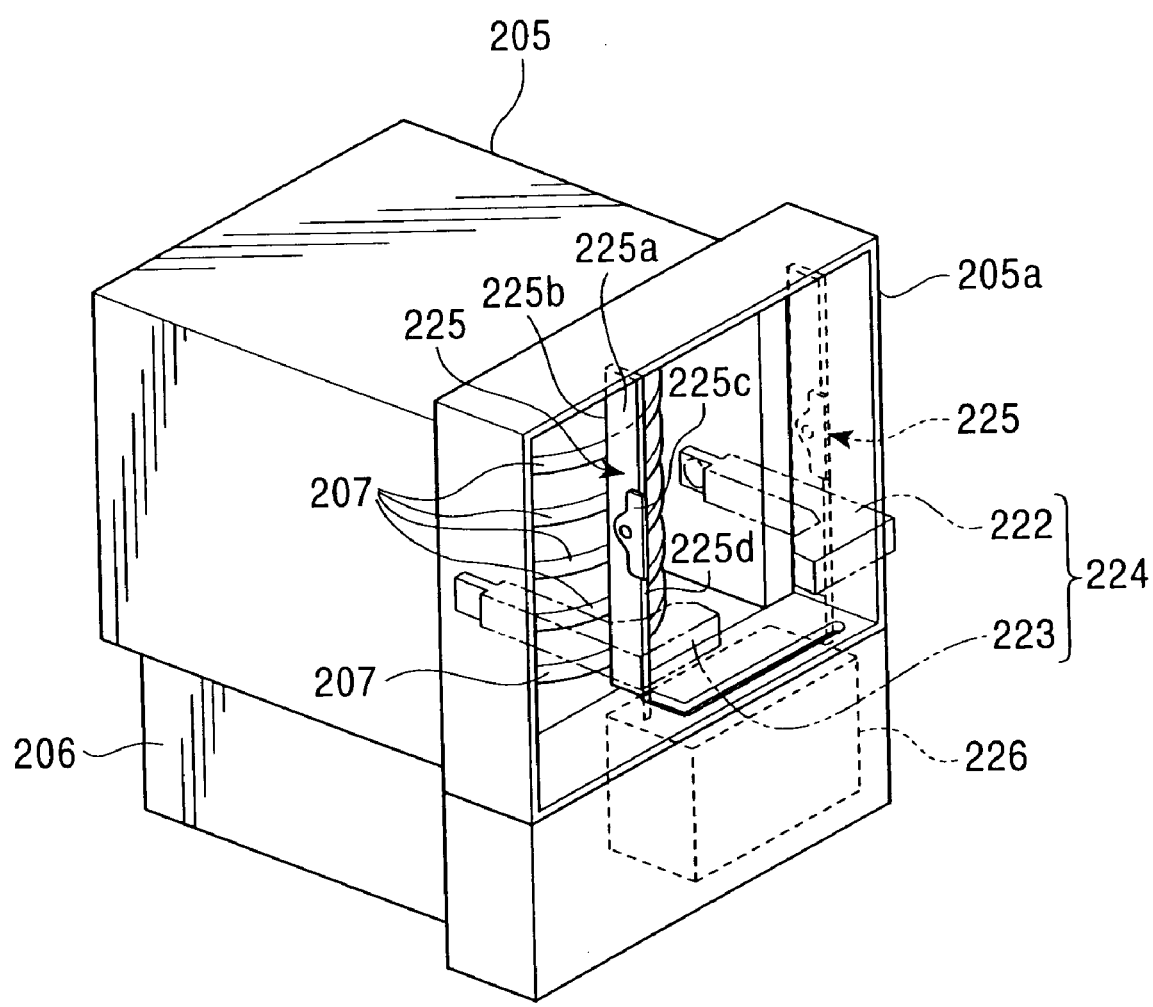
FIG. 18 is a perspective view showing a relationship of the positions of the buffer cassette, the pressing member, and a mapping sensor.

Next, the lower arm 221 is operated, and as shown in FIG. 18, the tip end of the mapping sensor 224 is advanced to an inner side of the buffer cassette 205. Since the wafer 207 is formed in a disk shape, the mapping sensor 224 can be advanced into the inner side of the buffer cassette 205 to a degree to not contact against the wafer 207 with a light path formed between the projector 222 and the light sensor 223 crossing the wafer 207 in a plan view. By operating the elevating and descending mechanism 211 under a state in which the mapping sensor 224 is advanced to such a position, the mapping sensor 224 provided on the lower arm 221 is elevated or descended to detect the presence or the absence of the wafer 207 in each bin 208 of the buffer cassette 205. Then, when the light sensor 223 detects that the light projected by the projector 222 of the mapping sensor 224 is shut by an edge of the wafer 207 at a bin located at a certain height, it is detected that there is the wafer 207 located at that position. In such a manner, the presence or the absence of the wafer 207 in each bin 208 of the buffer cassette 205 is confirmed. Then, it is controlled to store the wafer 207 by the lower arm 221 or the upper arm 220 to the bin 208 which is not placed with the wafer 207.

Moreover, in the case the wafer 207 is stored in a slanting state when looking from the side of the opening 205a of the buffer cassette 205 (for example, in the case the left and right edges of the wafer 207 are stored in different bins 208 respectively), a period of time when the light of the projector 222 is shut becomes long, or a width of the elevating and descending height shut from the light becomes wider when the single wafer transfer equipment 209 is elevating or descending under a constant speed. From this fact, it can be also confirmed whether or not the wafer 207 is stored in the buffer cassette 205 under a prescribed state. When detecting the bin 208 which is storing the wafer 207 in a slanting state, it is controlled for the wafer 207 to be not stored to the bin 208 by the lower arm 221 or the upper arm 220.

When the mapping sensor 224 is moving along the bin, in the case the wafers 207·207 . . . are displaced to the side of the opening 205a than a prescribed storage position within the buffer cassette 205, the mapping sensor 224 contacts against the wafer 207, and there is a possibility for the wafer 207 to be damaged. Further, regarding the case in which the wafers 207·207 . . . are displaced within the buffer cassette 205, for example, there is a case in which a worker places the wafers 207·207 . . . temporarily on the bin 208 and leaves the wafers 207·207 . . . as is under a state in which the wafers 207·207 . . . are jumping out from the opening 205a such that the stored wafers 207·207 . . . can be confirmed visually for convenience of the maintenance work.

Therefore, in the present invention, the pressing member 225 which presses the wafer is provided at the opening 205a. When mapping, the pressing member 225 pushes the wafers 207·207 . . . to the inner side of the buffer cassette 205 at a position closest to the opening 205a (a position at a center part of the front end of the wafer 207 in a plan view) among the edges of the wafers 207·207 . . . .

Further, there are cases when the wafer 207 within the buffer cassette 205 jumps out from the opening 205a of the bin 208 due to an acceleration and a deceleration during the traveling of the automated guided vehicle 201, not only by the wafer 207 being placed on the bin 208 by the hands of the worker. Therefore, in the automated guided vehicle 201 of the third embodiment, the pressing member 225 presses the wafers 207·207 . . . during the transportation and during the confirmation work of the wafer 207 by the mapping sensor 224. The confirmation of the presence or the absence of the wafer 207 by the mapping sensor 224 is carried out under a state in which the front end position of the wafers 207·207 . . . is held at a prescribed position by the pressing member 225. As a result, the wafers 207·207 . . . are prevented from contacting against the mapping sensor 224 and being damaged.

The pressing member 225 includes a main body 225a, a contacting part 225b, a pivotal body 225c, and a rod 225d. The contacting part 225b is provided at a rear surface of the main body 225a. The contacting part 225b is a part which contacts against the wafers 207·207 . . . when the wafers 207·207 . . . are fixed by the pressing member 225. The contacting part 225b is formed from an elastic body such as a conductive resin. The contacting part 225b pushes the edge of the wafers 207·207 . . . to the inner side of the buffer cassette 205 without damaging or contaminating the wafers 207·207 . . . . In addition, the contacting part 225b also has a function to release a static electricity, which the semiconductor wafer or the like is easily affected, to the automated guided vehicle 201. The pivotal body 225c is mounted to the center part of the main body 225a such that the pivotal body 225c can swing. The rod 225d is protruding downward from the lower end of the pivotal body 225c. Moreover, the rod 225d is provided at a wafer fixing mechanism 226 which is provided inside the buffer cassette table 206. A drive means such as an air cylinder is provided at the wafer fixing mechanism 226. The rod 225d can move along a groove having a shape of letter L which is drilled at the opening 205a, between a position which does not interfere during the transferring of the wafer 207, and a position where the wafer 207 can be fixed in place on the bin of the buffer cassette 205. Therefore, the pressing member 225 which is provided on the rod 225d can be pushed against the front end of the wafers 207·207 . . . , or the pressing member 225 can be evacuated to a proximity of the side wall of the opening 205a (position shown with dashed line in FIG. 18) such that to not interfere with the transferring of the wafers 207·207 . . . . The pressing member 225 prevents the mapping sensor 224 from contacting against the wafer 207 during the mapping.

In addition, the pressing member 225 maintains the wafer 207 at a prescribed position in the buffer cassette 205. Therefore, the pressing member 225 is preferable to be provided in proximity to the left-right center of the opening 205a. However, the pressing member 225 can be displaced to either the left or the right within a range not interfering with the mapping sensor 224.

Further, a means for restricting the wafers 207·207 . . . from jumping out from the opening of the buffer cassette 205 is not limited to the pressing member 225 of the third embodiment. The means can be other means if the means does not interfere with elevating and descending of the mapping sensor 224 under a state in which the wafer 207 is fixed when the mapping sensor 224 confirms the presence or the absence of the wafers 207·207 . . . within the buffer cassette 205, and if the means can recede to a position not to interrupt unloading and loading of the wafer 207 during the transferring of the wafer 207.

The confirmation of the presence or the absence of the wafers 207·207 . . . within the buffer cassette 205 is carried out not only immediately after the recovery at the generation of abnormalities such as a power failure, but for example, the confirmation is carried out before a start of the normal transfer work. The mapping sensor 224 is elevated and descended under a state in which the wafers 207·207 . . . are pressed by the pressing member 225.

By forming in the above-described way, the mapping sensor 224 can be prevented from contacting against the wafers 207·207 . . . and being damaged. The confirmation of the presence or the absence of the wafers 207·207 . . . within the buffer cassette 205 before the transfer work can be carried out reliably.

Moreover, by transporting the wafers 207·207 . . . under a state in which the wafers 207·207 . . . are pressed by the pressing member 225, the wafers 207·207. . . are prevented from jumping out from the opening 205a of the buffer cassette 205 due to the acceleration and deceleration of the automated guided vehicle 201 during the transportation. Furthermore, by providing the mapping sensor 224 to the single wafer transfer equipment 209, the mapping sensor 224 can be elevated and descended by using the elevating and descending mechanism 211 provided in the single wafer transfer equipment 209. Therefore, it is not necessary to newly provide an operation unit for elevating and descending the mapping sensor 224 vertically, and the structure of the device can be simplified.

Further, in the third embodiment, the mapping sensor 224 is provided on a side of the upper plate 217L of the lower arm 221. However, the position where the mapping sensor 224 is provided on the single wafer transfer equipment 209 is not limited if the mapping sensor 224 can move to a prescribed position within the buffer cassette 205. Moreover, the mapping sensor 224 can be provided at a position other than the single wafer transfer equipment 209. For example, an elevating and descending unit which can elevate and descend vertically along the bin 208 of the buffer cassette 205 can be provided to the opening 205a, and the mapping sensor 224 can be provided at the elevating and descending unit. Moreover, the shape of the mapping sensor 224 is also not limited, and if the shape is a shape which can elevate and descend without contacting against the buffer cassette 205 or the wafers 207·207 . . . , same effect can be obtained.

EFFECTS OF THE PRESENT INVENTION

Since the present invention is made as described above, following effects can be obtained.

That is, according to claim 1, the automated guided vehicle includes a transfer equipment which transfers a wafer, and a buffer cassette which temporarily stores the wafer. In the automated guided vehicle, a pressing member which presses the wafer stored in the buffer cassette by contacting against the edge of the wafer, is provided at the opening of the buffer cassette. The pressing member is movable between the "pressing" position which presses the wafer by contacting against the edge of the wafer, and the "receding" position which is located away from the edge of the wafer. The transfer direction of the pressing member from the "receding" position to the "pressing" position at a moment when the pressing member contacts against the edge of the wafer is formed to be approximately perpendicular to an outline of the part of the wafer contacting against the pressing member. Therefore, the pressing member transfers approximately perpendicular to the outline of the wafer when contacting against the wafer. Thus, the damage applied to the wafer by the pressing member rubbing against the edge of the wafer can be reduced, and the durability of the pressing member can be improved considerably.

According to claim 2, the transferring path of the pressing member is formed from the first transferring path and the second transferring path. The first transferring path is provided approximately along a direction to load and unload the wafer to the buffer cassette by the transfer equipment, and in a direction toward a center of the wafer within the buffer cassette. The second transferring path connects an edge which is far away from the center of the wafer of the first transferring path, and the edge of the opening of the buffer cassette. The center of the wafer is pressed by the pressing member. Therefore, the displacement of the wafer within the buffer cassette or the jumping out of the wafer from the buffer cassette can be prevented reliably. Moreover, since the "receding" position is set at the edge of the opening of the buffer cassette, the wafer can be loaded and unloaded to the wafer smoothly.

The pressing member transfers from the "receding" position at the edge of the opening of the wafer to the "pressing" position which presses the center of the wafer in two stages by the second transferring path and the first transferring path. Under such a simple structure, the wafer can be prevented from being damaged by rubbing along the outline of the wafer, and the pressing member can be transferred easily.

Moreover, according to claim 3, by adopting an elastic member for the pressing member, the vibration of the wafer during the traveling can be absorbed, and the wafer can be transported more safely.

According to claim 4, the pressing force of the pressing member against the wafer stored in the buffer cassette is limited by the stopper. As a result, the pressing force applied to the wafer can be controlled, and the wafer can be prevented from being damaged.

Moreover, according to claim 5, the buffer cassette includes a plurality of bins, and a sensor which transfers along the plurality of bins to detect the presence or the absence of the wafer in each bin. The sensor operates when the pressing member is located at the "pressing" position. Therefore, even if the wafer stored in the bin jumps out to the opening side during the transportation, the sensor can be operated under a state in which the wafer is transferred to the inner side by the pressing member. As a result, the damage can be prevented from being applied to the wafer by the transferring of the sensor. In addition, the wafer can be located at a prescribed position, and this state can be maintained. As a result, the presence or the absence of the wafer can be detected even more reliably.

According to claim 6, the automated guided vehicle includes the transfer equipment, the buffer cassette, and the pressing means for pressing a flat object stored in the buffer cassette. The pressing means includes the stopper for limiting the pressing force against the flat object. Therefore, the pressing force applied to the flat object from the pressing means can be limited by the stopper, and the flat object can be prevented from being damaged.

According to claim 7, the pressing means includes a pressing member which contacts against the flat object. The pressing member can swing with the approximately the center part in the longitudinal direction as a fulcrum. Therefore, even when the protruding amount of the flat objects stored in the buffer cassette differ at the upper part and the lower part of the buffer cassette, all of the flat objects can be pressed reliably by the swing of the pressing member.

Moreover, according to claim 8, a swing stopper is provided on the pressing means. The swing stopper is formed from an elastic deformable member, and controls the swing of the pressing member due to the weight of the pressing member. Therefore, the pressing member formed capable of swinging does not swing until contacting against the flat object. As a result, even when the amount of the stored flat object is small, all of the flat objects can be pressed reliably.

According to claim 9, the automated guided vehicle includes the buffer cassette having a plurality of bins for storing the wafer, and the single wafer transfer equipment which transfers the wafer. In addition, the automated guided vehicle includes a pressing member which presses the wafer stored in the buffer cassette from the opening of the buffer cassette to the inner side, and a sensor which transfers along the plurality of bins to detect the presence or the absence of the wafer in each bin. Therefore, by detecting the presence or the absence of the wafer stored in each bin of the buffer cassette, the wafer is prevented from being transferred to the bin where a different wafer is already stored and being damaged. Furthermore, the wafer can be pressed by the pressing member when detecting the presence or the absence of the wafer. Therefore, even when the wafer stored in the bin is jumping out to the opening side, the wafer can be moved to the inner side by the pressing member, and the damage can be prevented from being applied to the wafer due to the transferring of the sensor. Moreover, the wafer can be provided at a prescribed position by the pressing member, and this state can be maintained. As a result, the presence or the absence of the wafer can be detected even more reliably.

According to claim 10, the pressing member also functions as means for preventing the jumping out of the wafer during the transportation. Therefore, the wafer can be prevented from jumping out from the buffer cassette or from being displaced due to the acceleration and the deceleration of the automated guided vehicle when transporting the wafer by traveling the automated guided vehicle. Thus, even during the traveling, the wafer can be maintained at a prescribed position in the bin of the buffer cassette.

According to claim 11, the sensor is provided in the transfer equipment having an elevating and descending mechanism. Therefore, by using the elevating and descending mechanism provided in the transfer equipment, the mapping sensor can be elevated and descended. Thus, it is not necessary to newly provide a moving unit for elevating and descending the mapping sensor vertically, and the structure of the device can be simplified.

The invention claimed is:

1. An automated guided vehicle comprising:
   transfer equipment;
   a buffer cassette; and
   a pressing means for pressing a flat object stored in the buffer cassette;
   an actuator to move the pressing means by moving a moved member; and
   a stopper provided to the pressing means for limiting a pressing force of the pressing means against the flat object by regulating movement of the moved member carried out by the actuator,
   wherein the pressing means includes a pressing member supported by a supporting member, wherein the pressing member contacts against the flat object, and the pressing member can swing with the support member as a fulcrum.

2. The automated guided vehicle according to claim 1, wherein the pressing means includes a swing stopper which is formed from an elastic deformable member and which controls a swing of the pressing member due to a weight of the pressing member.

* * * * *